US010038077B2

(12) United States Patent
Kim et al.

(10) Patent No.: US 10,038,077 B2
(45) Date of Patent: Jul. 31, 2018

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Jong-Hyuk Kim, Seoul (KR); Kang-Ill Seo, Chungcheongbuk-do (KR); Hyun-Jae Kang, Gunpo-si (KR); Deok-Han Bae, Anyang-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 48 days.

(21) Appl. No.: 15/234,484

(22) Filed: Aug. 11, 2016

(65) Prior Publication Data

US 2016/0380084 A1    Dec. 29, 2016

Related U.S. Application Data

(63) Continuation of application No. 14/554,107, filed on Nov. 26, 2014, now Pat. No. 9,472,653.

(51) Int. Cl.
| | | |
|---|---|---|
| *H01L 21/00* | (2006.01) | |
| *H01L 29/66* | (2006.01) | |
| *H01L 21/3213* | (2006.01) | |
| *H01L 21/033* | (2006.01) | |
| *H01L 21/311* | (2006.01) | |
| *H01L 21/308* | (2006.01) | |

(52) U.S. Cl.
CPC .... *H01L 29/66795* (2013.01); *H01L 21/0337* (2013.01); *H01L 21/3086* (2013.01); *H01L 21/31144* (2013.01); *H01L 21/32139* (2013.01)

(58) Field of Classification Search
CPC ......... H01L 21/31144; H01L 21/0337; H01L 21/32139
See application file for complete search history.

(56) References Cited

U.S. PATENT DOCUMENTS

| | | | |
|---|---|---|---|
| 8,383,299 B2 | 2/2013 | Hsieh et al. | |
| 8,465,908 B2 | 6/2013 | Choi | |
| 8,557,675 B2 * | 10/2013 | LiCausi | ........... H01L 21/28132 257/48 |

(Continued)

FOREIGN PATENT DOCUMENTS

| | | |
|---|---|---|
| KR | 100137997 | 2/1998 |
| KR | 1020050002380 | 1/2005 |
| KR | 1020080071328 | 8/2008 |

*Primary Examiner* — Laura Menz
(74) *Attorney, Agent, or Firm* — F. Chau & Associates, LLC

(57) ABSTRACT

A method of fabricating a semiconductor device is provided. A plurality of target patterns is formed on a substrate. The plurality of target patterns is extended in parallel to each other along a first direction. A first mask pattern extending in the first direction and including a plurality of first openings is formed. A second mask pattern extending in a second direction crossing the first direction and including a plurality of second openings is formed. Each second opening overlaps each first opening to form an overlapped opening region. A region of the plurality of target patterns is etched through the overlapped opening region using the first mask pattern and the second mask pattern as a etch mask. The region of the plurality of target patterns is overlapped with the overlapped opening region.

6 Claims, 26 Drawing Sheets

(56) References Cited

U.S. PATENT DOCUMENTS

| | | | |
|---|---|---|---|
| 8,871,104 B2 | 10/2014 | Park et al. | |
| 9,123,656 B1* | 9/2015 | Hsieh | H01L 21/3086 |
| 9,472,653 B2* | 10/2016 | Kim | H01L 21/32139 |
| 9,659,871 B2* | 5/2017 | Azmat | H01L 27/11807 |
| 9,761,436 B2* | 9/2017 | Chang | H01L 21/02071 |
| 2009/0053623 A1 | 2/2009 | Lee | |
| 2011/0111330 A1* | 5/2011 | Schultz | G03F 1/36 430/5 |
| 2011/0111348 A1* | 5/2011 | Schultz | H01L 21/033 430/312 |
| 2012/0235243 A1 | 9/2012 | He et al. | |
| 2013/0143372 A1* | 6/2013 | Kim | H01L 21/3081 438/163 |
| 2013/0154004 A1* | 6/2013 | Liu | H01L 29/66795 257/347 |
| 2013/0187222 A1 | 7/2013 | Park | |
| 2013/0210232 A1 | 8/2013 | De et al. | |
| 2013/0244430 A1 | 9/2013 | Lin | |
| 2014/0273441 A1* | 9/2014 | Kim | H01L 21/283 438/666 |
| 2015/0243510 A1* | 8/2015 | Clevenger | H01L 21/3085 438/584 |
| 2015/0380261 A1* | 12/2015 | Chang | H01L 21/308 438/690 |
| 2016/0148808 A1* | 5/2016 | Kim | H01L 21/32139 438/587 |
| 2016/0343575 A1* | 11/2016 | Maeda | H01L 21/31144 |
| 2016/0380084 A1* | 12/2016 | Kim | H01L 21/32139 438/587 |
| 2017/0004973 A1* | 1/2017 | Kim | H01L 21/3086 |
| 2017/0229478 A1* | 8/2017 | Azmat | H01L 27/11807 |

\* cited by examiner

METHOD FOR FABRICATING SEMICONDUCTOR DEVICE

CROSS-REFERENCE TO RELATED APPLICATION

This application is a continuation of U.S. application Ser. No. 14/554,107, filed on Nov. 26, 2014, the disclosure of which is incorporated by reference herein in its entirety.

TECHNICAL FIELD

The present inventive concept relates to a method for fabricating a semiconductor device.

DISCUSSION OF THE RELATED ART

Photolithography processes are used to form patterns from various layers using various light sources. A minimum feature resolution of patterns is determined by a wavelength of such light sources. Higher resolution photolithography processes have, finer patterns the photolithography processes generate. With the recent increase in the integration level of semiconductor devices, the minimum feature resolution of patterns is beyond the wavelength of the light sources.

SUMMARY

According to an exemplary method of fabricating a semiconductor device, a plurality of target patterns is formed on a substrate. The plurality of target patterns is extended in parallel to each other along a first direction. A first mask pattern extending in the first direction and including a plurality of first openings is formed. A second mask pattern extending in a second direction crossing the first direction and including a plurality of second openings is formed. Each second opening overlaps each first opening to form an overlapped opening region. A region of the plurality of target patterns is etched through the overlapped opening region using the first mask pattern and the second mask pattern as a etch mask. The region of the plurality of target patterns is overlapped with the overlapped opening region.

According to an exemplary method of fabricating a semiconductor device, a first hard mask layer is formed on a substrate. A plurality of spacers is formed on the first hard mask layer. A second hard mask layer covering the first hard mask layer and the plurality of spacers is formed. A block hard mask layer is formed on the second hard mask layer. A first mask pattern is formed on the block hard mask layer. The first mask pattern includes a first opening overlapping at least one spacer. A second mask pattern having a second opening is formed on the first mask pattern. The second opening overlaps the first opening to form an overlapped opening region. A region of the plurality of spacers is etched through the overlapped opening region using the first mask pattern and the second mask pattern as a etch mask. The region of the plurality of spacers and the overlapped opening region overlap each other.

According to an exemplary method of fabricating a semiconductor device, a first spacer and a second spacer are formed on a substrate. The first spacer and the second spacer extend in a first direction. A first mask pattern extending in the first direction, and including a first opening and a second opening is formed. The first opening and the second opening overlap the first spacer and the second spacer, respectively. A second mask pattern extending in a second direction crossing the first direction and including a third opening and a fourth opening is formed. The first opening overlaps the third opening at a first overlapped opening region. The second opening overlaps the fourth opening at a second overlapped opening. The first spacer is etched through the first overlapped opening region using the first mask pattern and the second mask pattern as a etch mask to divide the first spacer into a third spacer and a fourth spacer. The second spacer is etched through the second overlapped opening region using the first mask pattern and the second mask pattern as a etch mask to divide the second spacer into a fifth spacer and a sixth spacer. A first to fourth active fins are formed by etching the substrate using the third to sixth spacers as a etch mask.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
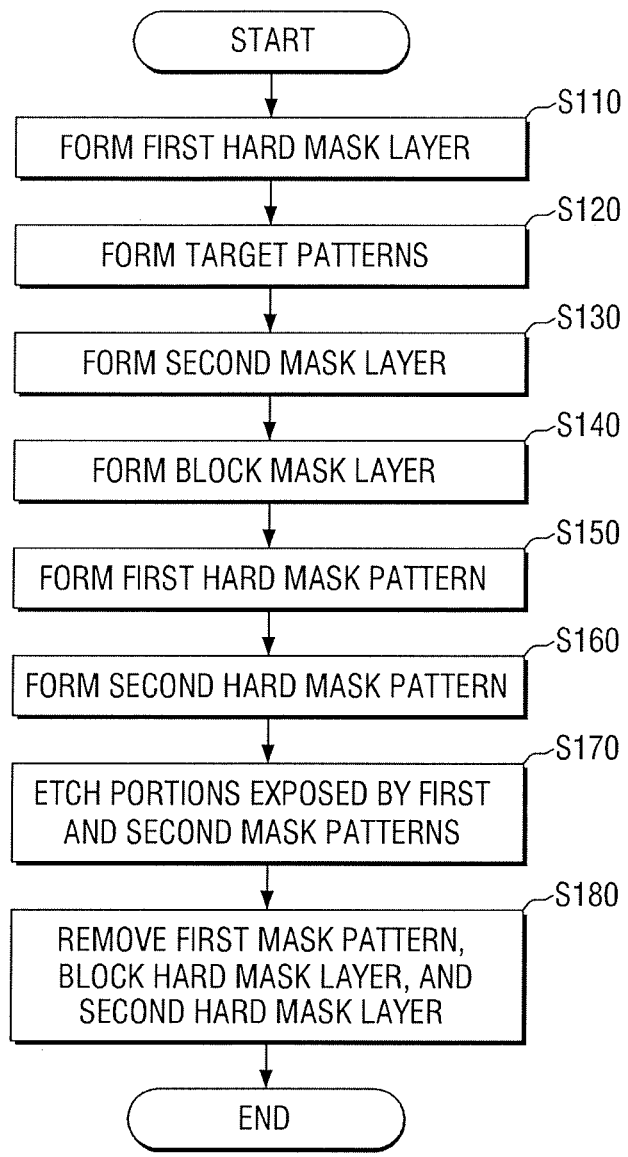
FIG. 1 is a flowchart illustrating a method for fabricating a semiconductor device according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a method for fabricating a semiconductor device according to an exemplary embodiment of the present inventive concept will be described with reference to FIGS. 1 to 15. FIG. 1 is a flowchart illustrating a method for fabricating a semiconductor device according to an exemplary embodiment of the present inventive concept and FIGS. 2 to 15 illustrate a method for fabricating a semiconductor device according to an exemplary embodiment of the present inventive concept.

Figure 2:
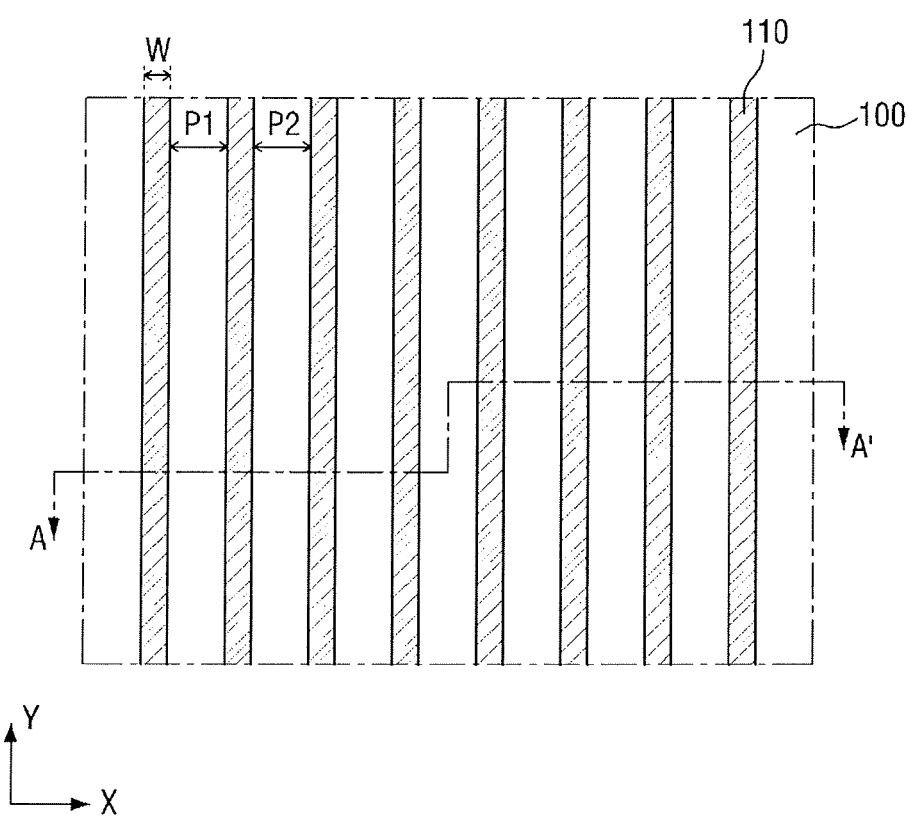
FIGS. 2 to 15 illustrate a method for fabricating a semiconductor device according to an exemplary embodiment of the present inventive concept.
Figure 3:
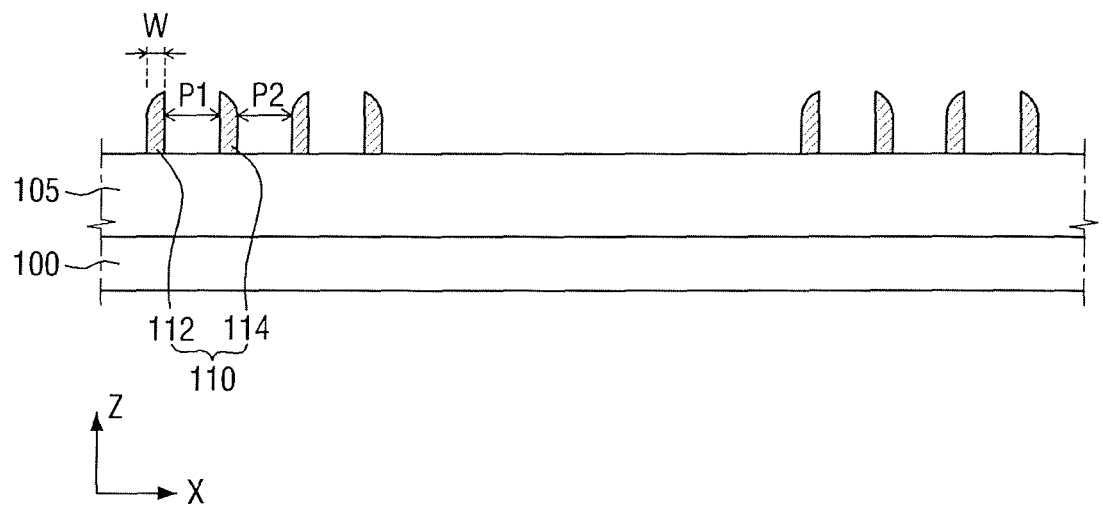

First, referring to FIGS. 1 to 3, a first hard mask layer 105 is formed on a substrate 100 (S100). Next, target patterns 110 are formed on the first hard mask layer 105 (S110). The target patterns 110 may include gates (not shown) or spacers (not shown).

The substrate 100 may include at least one of Si, Ge, SiGe, GaP, GaAs, SiC, SiGeC, InAs and InP. Alternatively, the substrate 100 may include a silicon on insulator (SOI) substrate. An isolation layer (not shown), such as a shallow trench isolation (STI), may be formed in the substrate 100.

The first hard mask layer 105 may include silicon, a metal-based material or a carbon-based material. For example, the first hard mask layer 105 may include at least one of polycrystalline silicon (poly Si), amorphous silicon (a-Si), titanium (Ti), titanium nitride (TiN), tantalum nitride (TaN), silicon oxide ($SiO_2$), silicon oxynitride (SiON) and a combinations thereof.

The target patterns 110 for a gate (not shown) may include silicon. For example, the gate may include at least one of polycrystalline silicon (poly Si), amorphous silicon (a-Si), titanium (Ti), titanium nitride (TiN), tantalum nitride (TaN), silicon oxide ($SiO_2$), silicon oxynitride (SiON) and a combination thereof. The gate made of polysilicon (poly Si) may be formed using, for example, a chemical vapor deposition process, and the gate made of amorphous silicon (a-Si) may be formed using, for example, a sputtering process, a chemical vapor deposition process, or a plasma deposition process, but is not limited thereto.

A spacer (not shown) may include nitrogen. For example, the spacer may include a silicon nitride (SiN) layer or a silicon oxynitride (SiON) layer.

FIG. 2 is a plan view illustrating an intermediate process step for explaining a method for fabricating a semiconductor device according to an exemplary embodiment of the present inventive concept, and FIG. 3 is a cross-sectional view taken along line A-A' of FIG. 2. An X-Y plane is illustrated in FIG. 2, and an X-Z plane is illustrated in FIG. 3. A first hard mask layer 105 is not shown in FIG. 2 for the convenience of description.

Referring to FIG. 2, the target patterns 110 are positioned on the first hard mask layer 105 disposed on the substrate 100. The target patterns 110 extend in parallel to each other in a first direction Y. The first direction Y may be the Y-axis direction. Each of the target patterns 110 has a width W. The target patterns 110 are spaced apart from each other with two alternative spacings of a first spacing P1 or a second spacing P2. Alternatively, the target patterns 110 may be evenly spaced apart from each other. In this case, the first spacing P1 and the second spacing P2 may be substantially equal to each other. The present inventive concept, however, is not limited thereto. The target patterns 110 are arranged in plurals on the substrate 100 to be parallel with each other.

The target patterns 110 are bar-shaped. The present inventive concept, however, is not limited thereto. For example, the target patterns 110 may have various shapes including, for example, an L-shape.

FIG. 3 is a cross sectional view taken along line A-A' of FIG. 2. The first hard mask layer 105 is formed on the substrate 100. The target patterns 110 are arranged on the first hard mask layer 105 with two alternative spacings of the first spacing P1 and the second spacing P2.

Each of the target patterns 110 may include a spacer (not shown), and the spacer may have a rounded top surface. A process of forming the spacer is widely known to one skilled in the art, and the following process is provided as an exemplary embodiment, but aspects of the present inventive concept are not limited thereto.

The spacer may be formed by forming a first sacrificial layer (not shown) on a first hard mask (not shown), forming a sacrificial pattern (not shown) by etching the first sacrificial layer, forming the spacer on opposite sidewalls of the sacrificial pattern and removing the sacrificial pattern. However, the present inventive concept is not limited thereto, and the spacer may be formed in various manners.

Figure 6:
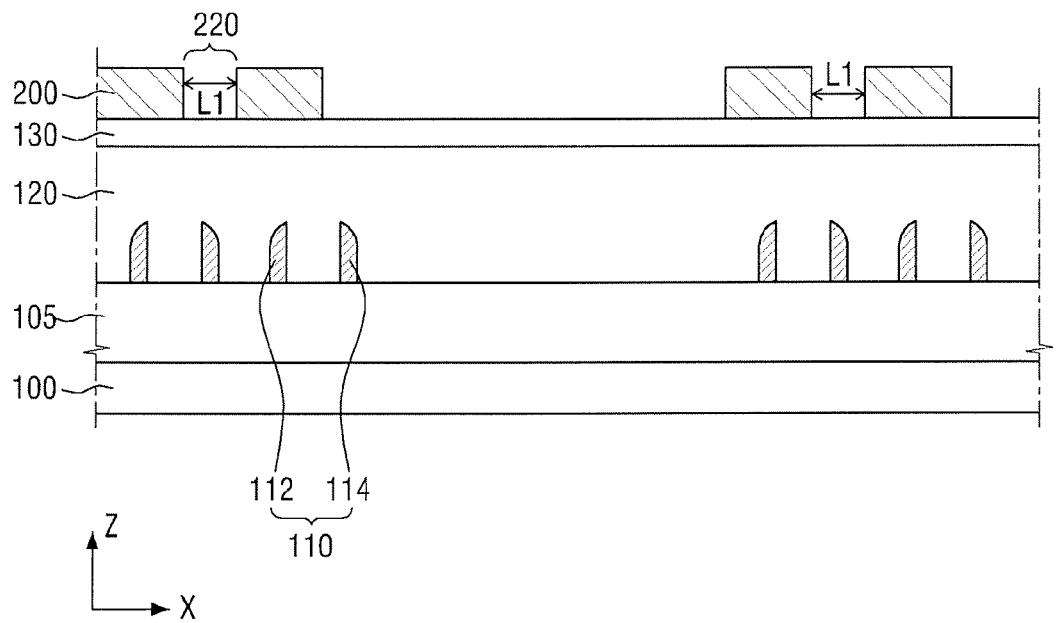

Referring to FIGS. 1 and 6, after the step S120, a second hard mask layer 120 covering the target patterns 110 and the first hard mask layer 105 is formed on the target patterns 110 (S130). The second hard mask layer 120 completely covers side surfaces and top surfaces of the target patterns 110. Next, a block hard mask layer 130 is formed on the second hard mask layer 120 (S140). The block hard mask layer 130 may serve to prevent the second hard mask layer 120 from being etched by a particular chemical substance used in a subsequent process. Next, a first mask pattern 200 is formed on the block hard mask layer 130 (S150).

Figure 4:
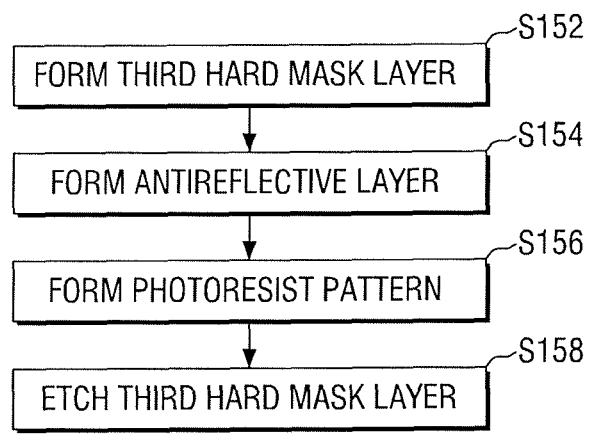

FIG. 4 is a flowchart illustrating a process for forming the first mask pattern 200 in step S150 of FIG. 1. The present inventive concept, however, is not limited thereto. The first mask pattern 200 may be formed using various manners.

Although not specifically shown, a third hard mask layer (not shown) is formed on the block hard mask layer 130 (S152). Next, an antireflective layer (not shown) is formed on the third hard mask layer (S154). The antireflective layer may serve to reduce reflection of light, thereby preventing an unintended photoresist pattern (not shown) from being formed due to the light reflected from the third hard mask layer during a lithography process. Next, a photoresist pattern is formed on the antireflective layer (S156) using a photolithography process. The photoresist pattern may be formed in the same manner with the first mask pattern 200. The photoresist pattern may overlap with at least one of the target patterns 110 positioned on the third hard mask layer. Next, the third hard mask layer is etched using the photoresist pattern as a barrier (S158). Through the above-described procedure, the first mask pattern 200 may be formed.

Figure 5:
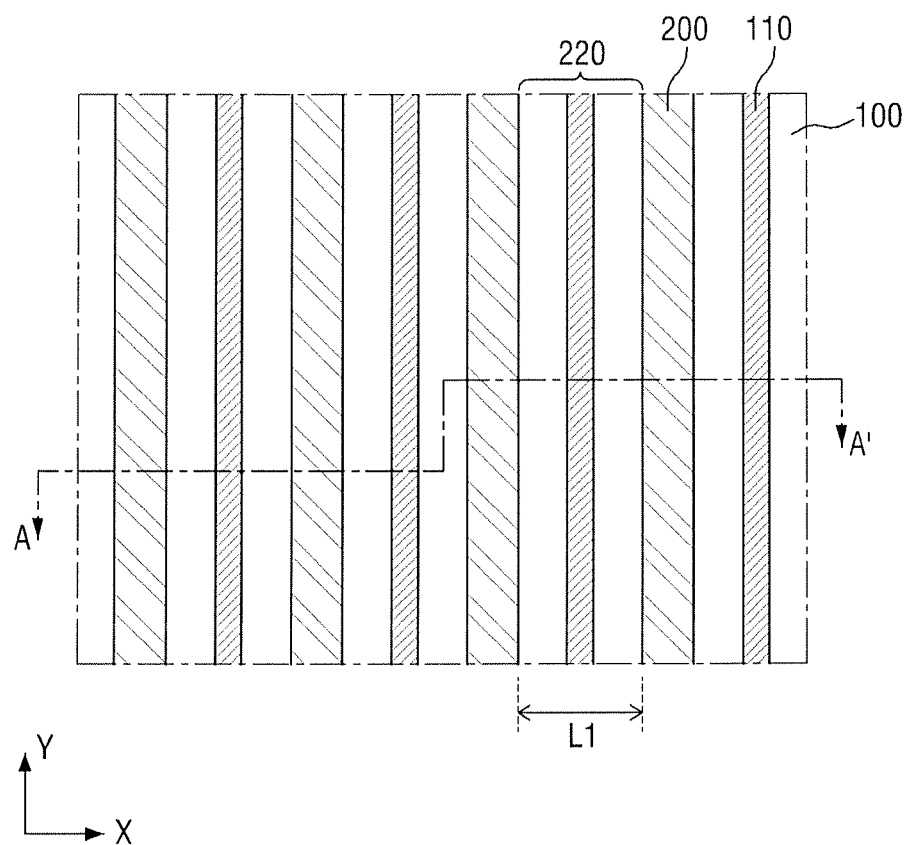

FIG. 5 is a plan view illustrating the process step S150 of FIG. 1, and FIG. 6 is a cross-sectional view taken along line A-A' of FIG. 5. An X-Y plane is illustrated in FIG. 5, and an X-Z plane is illustrated in FIG. 6.

A second hard mask layer 120 and a block hard mask layer 130 are not illustrated in FIG. 5 for the convenience of description.

Referring to FIGS. 1 and 5, after the process step shown in FIG. 2, the first mask pattern 200 is formed (S150). The first mask pattern 200 extends in the first direction Y, including a first opening 220 overlapping some of the target patterns 110.

The first mask pattern 200 overlaps the target patterns 112, and the first opening 220 overlaps the target patterns 114, extending in the first direction Y. Each of the target patterns 112, when viewed from the above, is not shown, because the target patterns 112 are underneath the first mask pattern 200. Each of the target patterns 114 is positioned at the center of the first opening 220. The first opening 220 and the target patterns 110 are arranged in parallel to each other. The first opening 220 may bisect the first mask pattern 200. The first opening 220 has a width of a first length L1. The first length L1 may be greater than the first spacing P1 and/or the second spacing P2 between the target patterns 110, as shown in FIG. 3. The present inventive concept is not limited thereto. For example, the first length L1 may be substantially equal to the first spacing P1 and/or the second spacing P2.

The first mask pattern 200 may include a plurality of first openings 220. The plurality of first openings 220 and the target patterns 114 are alternately arranged. The present inventive concept, however, is not limited thereto.

FIG. 6 is a cross sectional view taken along line A-A' of FIG. 5.

Referring to FIG. 6, after the process step shown in FIG. 3, the second hard mask layer 120 is formed on the first hard mask layer 105 and the plurality of target patterns 110, and the block hard mask layer 130 is formed on the second hard mask layer 120. Next, the first mask pattern 200 is formed on the block hard mask layer 130. The target patterns 114 are positioned under the openings 220, and target patterns 114 are positioned under the first mask pattern 200.

The first mask pattern 200 may include a metal based hard mask such as, for example, titanium (Ti), titanium nitride (TiN), tantalum nitride (TaN), or a combination thereof. The present inventive concept, however, is not limited thereto.

The first mask pattern 200 includes the first opening 220, and the first opening 220 has a width of the first length L1. The first length L1 is measured along a second direction X. The first opening 220 overlaps the target patterns 114. The width of the first opening 220 may be greater than a width W of each of the target patterns 114. For example, the first length L1 may be n times a pitch (not shown) between spacers or a pitch (not shown) between gates and the first opening 220 may overlap n spacers (not shown), which will later be described in detail.

Figure 7:
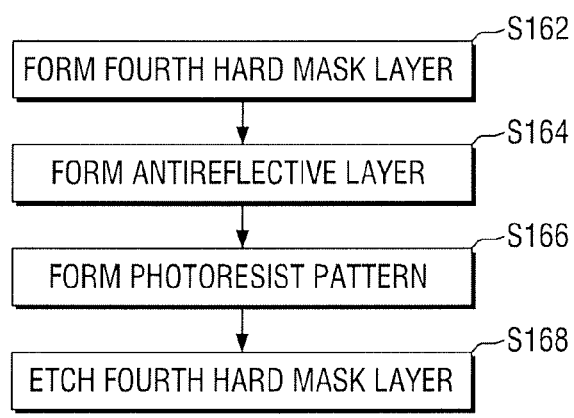

FIG. 7 is a flowchart illustrating a process for forming the second mask pattern 300 in step S160 of FIG. 1. The present inventive concept, however, is not limited thereto. The flowchart is provided only for illustrating an exemplary embodiment for forming the second mask pattern 300.

Although not specifically shown, a fourth hard mask layer (not shown) is formed on the block hard mask layer 130 (S162). Next, an antireflective layer (not shown) is formed on the fourth hard mask layer (S164). The antireflective layer may prevent an unintended photoresist pattern (not shown) from being formed due to the light reflected from the fourth hard mask layer during a lithography process. Next, a photoresist pattern is formed (S166). The photoresist pattern may be formed in the same manner with the first mask pattern 200. The photoresist pattern may be formed through a lithography process. The photoresist pattern may be formed on the fourth hard mask layer, and only a portion of the fourth hard mask layer is covered with the photoresist pattern. Next, the fourth hard mask layer is etched using the photoresist pattern as a etch mask (S168). Through the above-described procedure, the second mask pattern 300 is formed. The second mask pattern 300 may be formed in substantially the same manner with the first mask pattern 200, but aspects of the present inventive concept are not limited thereto. Rather, the second mask pattern 300 may be formed using a different chemical substance from the first mask pattern 200.

Figure 8:
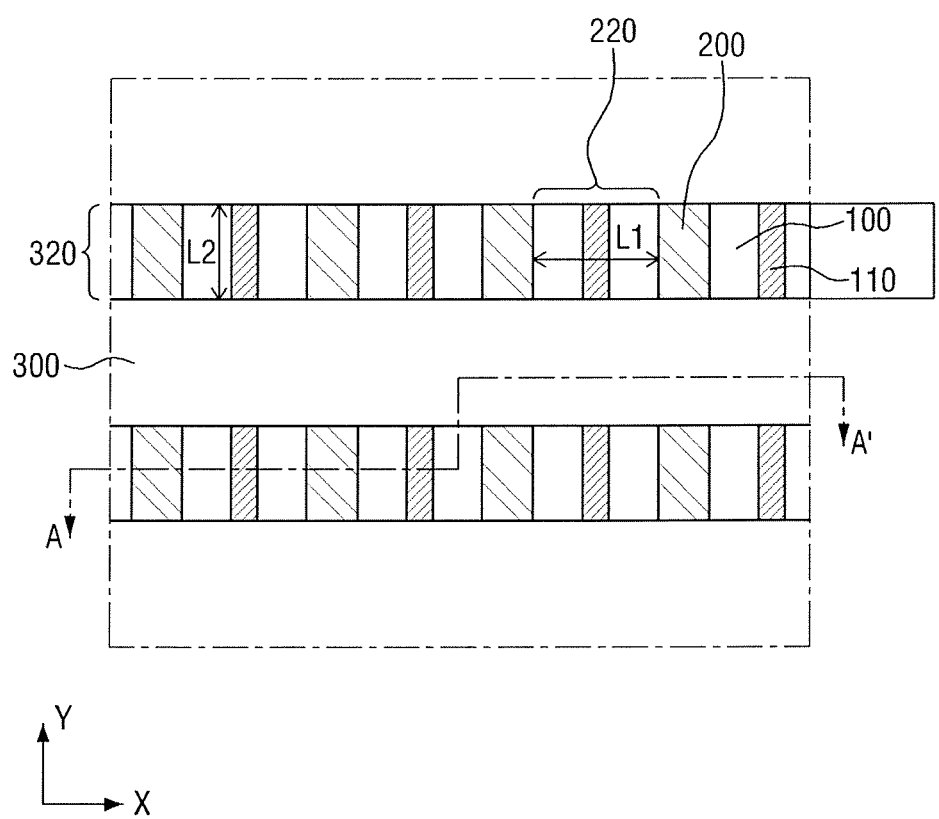
Figure 9:
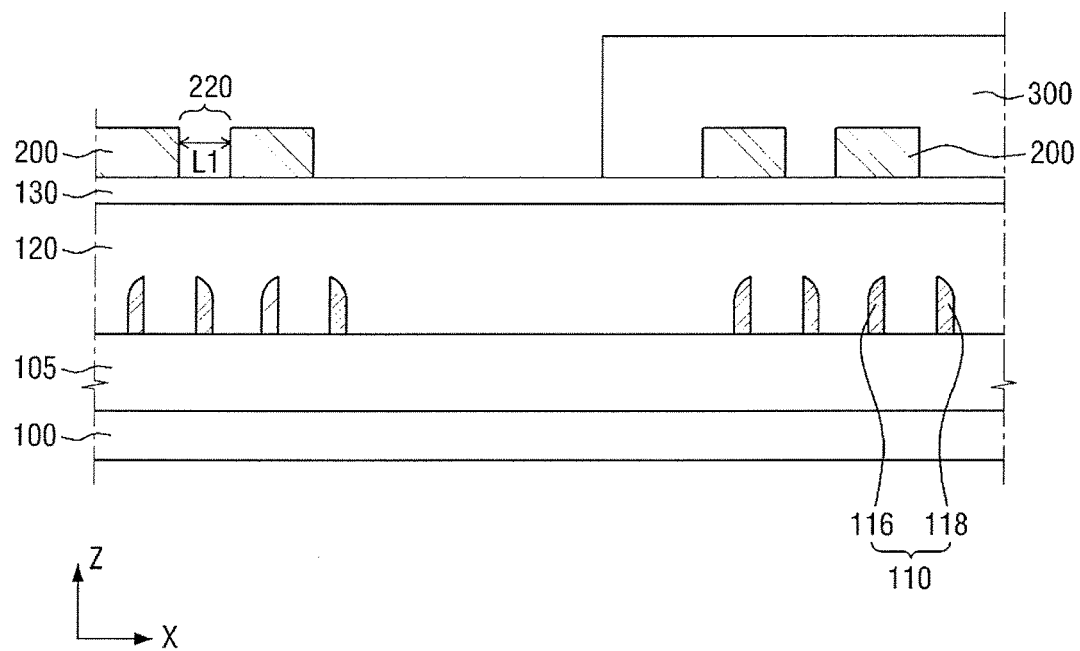

FIG. 8 is a plan view illustrating an intermediate process step for forming the second mask pattern 300 in step 160 of FIG. 1. FIG. 9 is a cross-sectional view taken along line X-X' of FIG. 8. An X-Y plane is illustrated in FIG. 8, and an X-Z plane is illustrated in FIG. 9.

A second hard mask layer 120 and a block hard mask layer 130 are not illustrated on the X-Y plane illustrated in FIG. 8.

Referring to FIGS. 1 and 8, after the process step shown in FIG. 5, a second mask pattern 300 is formed (S160). For example, the second mask pattern 300 extending in the second direction X crossing the first direction Y and including a second opening 320 overlapping with the first opening 220 is formed. The second opening 320 has a width of a second length L2 measured along the first direction Y.

The second mask pattern 300 overlaps portions of the target patterns 110 and the first mask pattern 200. The second mask pattern 300 crosses the first mask pattern 200. For example, the second direction X in which the second mask pattern 300 extends is substantially orthogonal to the first direction Y in which the first mask pattern 200 extends. The present inventive concept, however, is not limited thereto. The first direction Y may form an acute angle or an obtuse angle with respect to the second direction X.

The second mask pattern 300 includes the second opening 320. The second length L2 of the second opening 320 is disposed along the first direction Y. Portions of the target patterns 110, the first mask pattern 200 and the first opening 220 are disposed under the second opening 320. The second opening 320 extends along the second direction X.

The second opening 320 may bisect the second mask pattern 300. The present inventive concept, however, is not limited thereto. For example, the second mask pattern 300 may include a plurality of second openings 320 randomly arranged in the second mask pattern 300, which will be described in detail.

The second mask pattern 300 includes second openings 320. Each second opening 320 overlaps the first opening 220. For example, the second openings 320 are overlapped with the first opening 220 to form shared regions which are rectangular. The present inventive concept, however, is not limited thereto. For example, the shared regions may be polygonal or circular. The overlapping regions of the first opening 220 and the second openings 320 may include portions of the top surface exposed by the first opening 220.

The second openings 320 partially overlaps the target patterns 110. For example, the second openings 320 extending in the second direction X overlaps portions of top surfaces of the target patterns 110 extending in the first direction Y. The second mask pattern 300 overlaps portions of the target patterns 110 overlapped by the first opening 220. For example, the target patterns 110 include portions over which the second mask pattern 300 and the first opening cross each other. The second mask pattern 300 and the target patterns 110 are arranged to cross each other.

FIG. 9 is a cross sectional view taken along line A-A' of FIG. 8.

Referring to FIG. 9, after the process step shown in FIG. 6, the second mask pattern 300 is formed on the first mask pattern 200 and the block hard mask layer 130. The second mask pattern 300 covers portions of the first mask pattern 200 and the block hard mask layer 130.

For example, the second mask pattern 300 overlaps portions of the target patterns 110 and the first mask pattern 200. The second mask pattern 300 overlaps with a plurality of consecutive target patterns 110. The second mask pattern 300 overlaps target patterns 118 not overlapped with the first mask pattern 200.

The second mask pattern 300 may include a carbon-based hard mask such as, for example, silicon nitride (SiN), silicon oxynitride (SiON), polycrystalline silicon (poly Si), amorphous silicon (a-Si), and a combination thereof.

The second mask pattern 300 may include the same material with the second hard mask layer. Therefore, in a subsequent etching step, the second mask pattern 300 and the second hard mask layer 120 may be etched in the same process. The present inventive concept is not limited thereto.

Figure 10:
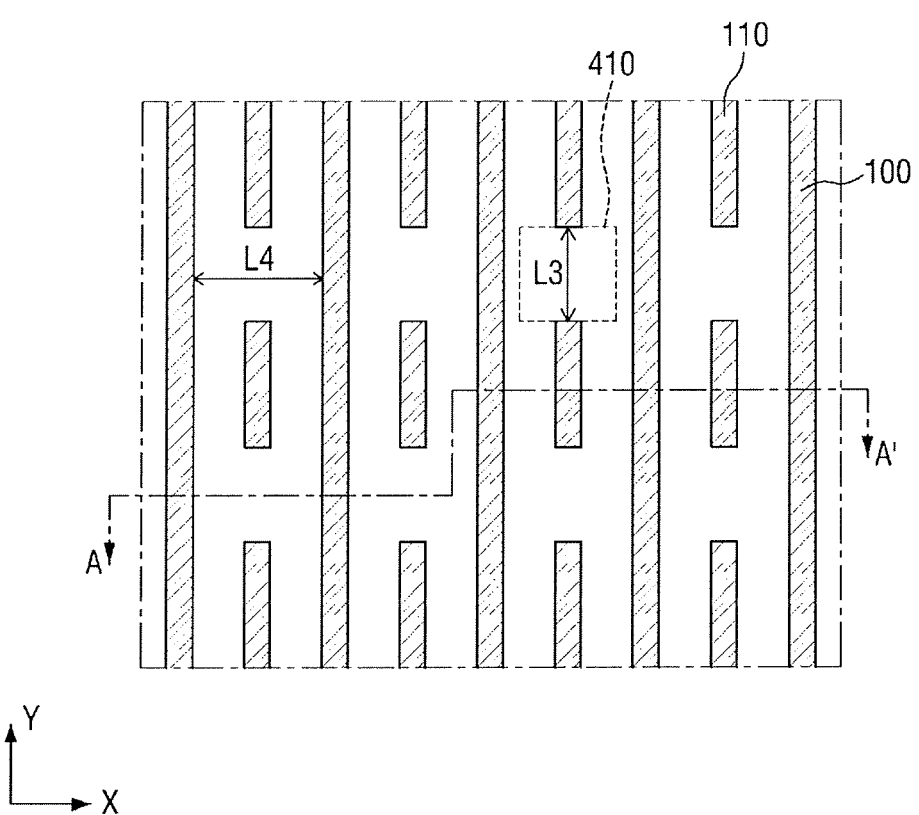

FIG. 10 is a plan view illustrating an intermediate process step for explaining a method for fabricating a semiconductor device according to an exemplary embodiment of the present inventive concept and FIGS. 11 to 15 are cross-sectional views illustrating intermediate process steps for explaining a method for fabricating a semiconductor device according to an exemplary embodiment of the present inventive concept. An X-Y plane is illustrated in FIG. 8, and an X-Z plane is illustrated in FIGS. 11 to 15. In FIG. 10, a first hard mask layer 105 is not illustrated.

Referring to FIGS. 1 and 10, after the process step shown in FIG. 8, the regions of the target patterns 110 may be etched through regions where the first opening 220 and the second opening 320 overlap each other. For example, the target patterns 110 are etched using the first mask pattern 200 and the second mask pattern 300 as a etch barrier (S170). Dry etching or wet etching processes may be employed.

The target patterns 110 etched through the etching process have a spacing having a third length L3 in the first direction Y and a spacing having a fourth length L4 in the second direction X. The fourth length L4 may be the largest one among spacings between each of unetched target patterns 110.

The third length L3 corresponds to a critical dimension (CD) after cleaning inspection (ACI). The third length L3 may be referred to as ACI CD, hereinafter. The ACI CD means a spacing between the etched target patterns 110 after etching followed by cleaning. The third length L3 may correspond to the second length L2 of the second mask pattern 300 shown in FIG. 8. The second length L2 corresponds to a critical dimension (CD) after developing inspection (ADI). The second length L2 may be referred to as ADI CD, hereinafter. The ADI CD means a width of the second opening 320 of the second mask pattern 300 before etching. A constant value of skew may exist between the ADI CD and the ACI CD. An accurate value of skew may be calculated when the ADI CD and the ACI CD are positioned on the same line.

The ACI CD may be accurately measured when the etched target pattern 110 has a uniform cross section. When an opening of the second mask pattern 300 is shaped of a circular hole or curve, a slope may be created at cross sections of the etched target patterns 110. Such sloped cross sections may cause an error in measuring the ACI CD to be increased.

In addition, such sloped cross sections of the etched target patterns 110 may cause defects in a subsequent process of epitaxially forming eSiGe. In this case, defects may occur to end portions of the target patterns 110.

When the first opening 220 of the first mask pattern 200 and the second opening 320 of the second mask pattern 300 cross each other at substantially right angle to form an overlapped opening region, the divided target pattern 110 by using the overlapped opening region may have a cross section without a rounded corner. In this case, since the ACI CD and the ADI CD are positioned on the same line, a relatively accurate value of skew can be calculated.

In addition, the cross section of the truncated target pattern 110 may become substantially linear, thereby increasing a probability of avoiding defects due to the abnormal SiGe process or epitaxial growth, but aspects of the present inventive concept are not limited thereto.

The calculated value of skew may be used in optical proximity correction (OPC). An accurate value of skew may increase the accuracy of the OPC.

An etched target pattern region 410 and the unetched target pattern 110 overlapping with the first mask pattern 200 are alternately arranged. The etched target pattern region 410 may be substantially the same with the overlapping region of the first opening 220 and the second opening 320.

FIGS. 11 to 15 are cross sectional views taken along line A-A' of FIG. 10.

Figure 11:
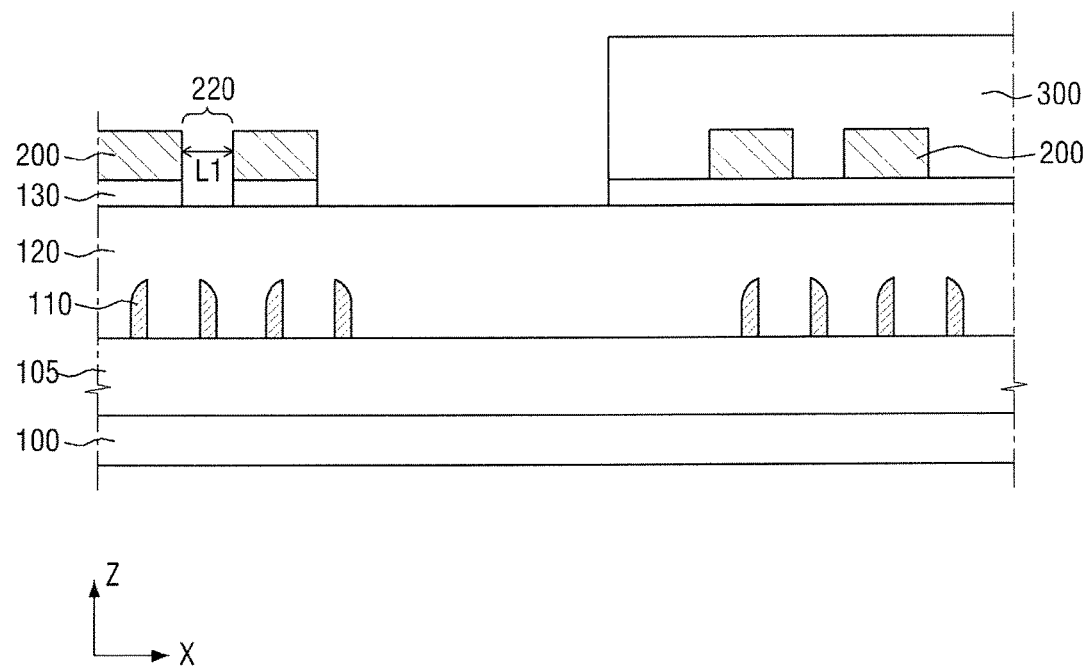

Referring to FIG. 11, a first etching process is performed to etch a portion of the block hard mask layer 130 under the overlapping region of the first opening 220 and the second opening 320. (S180). For example, the first etching process may be a dry etching or reactive ion etching (RIE) process. In the dry etching, for example, a mixed gas including oxygen may be used as an etching gas. The mixed gas used as the etching gas may include chlorine as well as oxygen. In addition, the mixed gas may further include helium, but the present inventive concept is not limited thereto.

Figure 12:
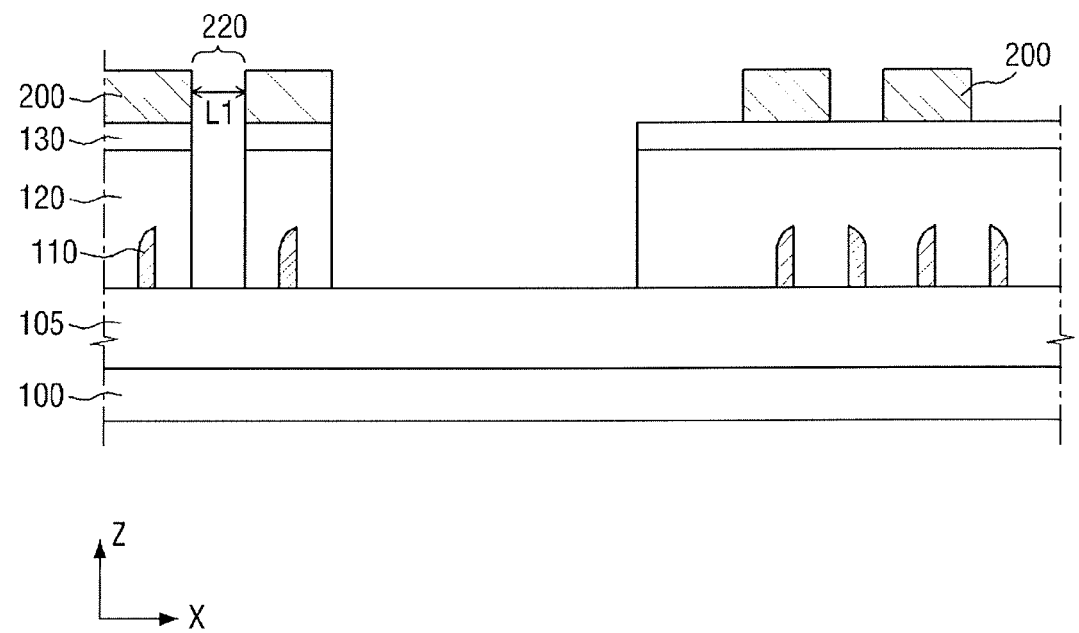

Referring to FIG. 12, after the process step shown in FIG. 11, a second etching process is performed to etch a portion of the second hard mask layer 120. (S180). For example, the portion of the second hard mask layer 120 is etched through the first opening 220. A region of the second hard mask layer 120 under the block hard mask layer 130 need not be etched in the second etching process. The second hard mask layer 120 may include the same material with the second mask pattern 300. Therefore, the second hard mask layer 120 and the second mask pattern 300 may be etched in the same time process.

The second etching process may be performed using a different method from the first etching process. For example, the second etching process may be performed using a gas that is not used in the first etching process, but the present inventive concept is not limited thereto.

Figure 13:
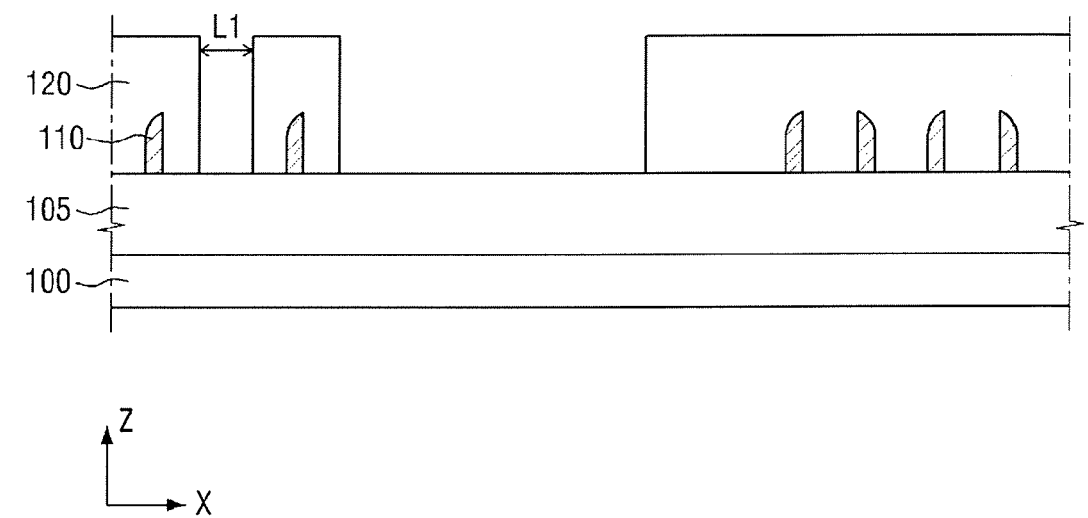

Referring to FIG. 13, after the process step shown in FIG. 12, a third etching process is performed to remove the first mask pattern 200 and the block hard mask layer 130 from the resulting structure of FIG. 12. (S180). The third etching process and the first etching process may be performed using substantially the same method, but the present inventive concept is not limited thereto.

Figure 14:
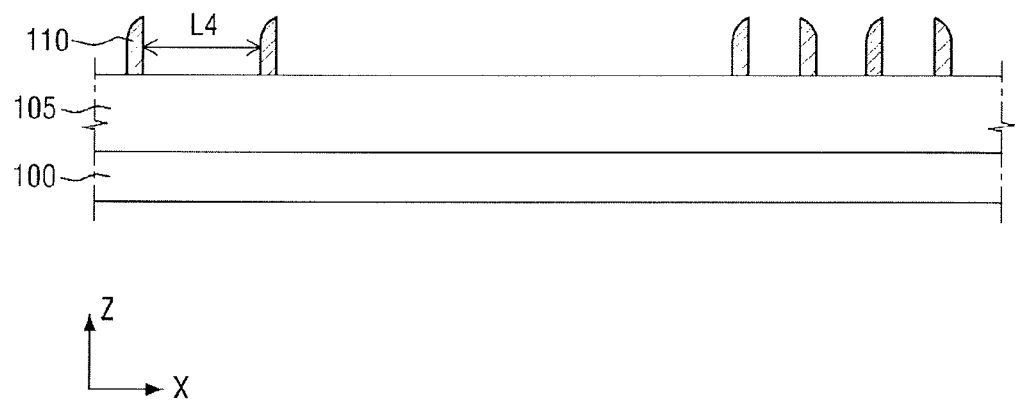

Referring to FIG. 14, after the process step shown in FIG. 13, a fourth etching process is performed to remove the second hard mask layer 120 from the resulting structure of FIG. 13. (S180). Through the first to fourth etching processes, the block hard mask layer 130 and the second hard mask layer 120 are sequentially removed using the first and second mask patterns 200 and 300.

Through the first to fourth etching processes, the target pattern (not shown) disposed under the overlapping region of the first opening 220 and the second opening 320 is removed, thereby leaving the target patterns 110 only remaining on the first hard mask layer 105.

The remaining target patterns 110, part of spacers (not shown), may be used in a double patterning technology (DPT) process. For example, the spacers may be used as masks for forming a gate (107 of FIG. 15) in the first hard mask layer 105. The DPT process may be used in forming fine patterns.

Figure 15:
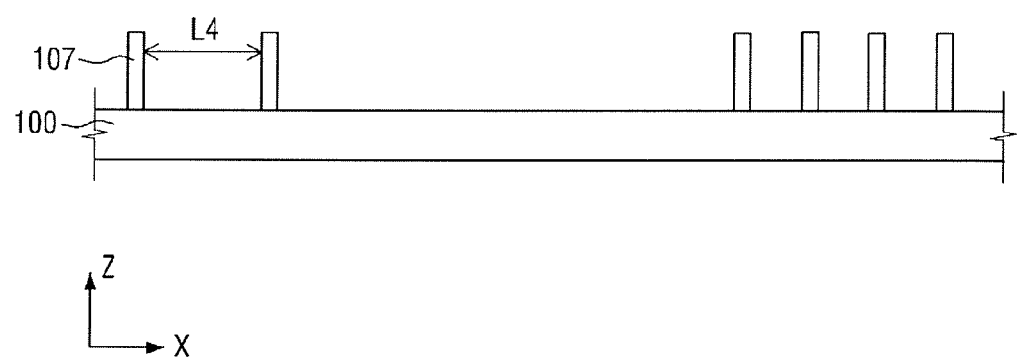

Referring to FIG. 15, after the process step shown in FIG. 14, the first hard mask layer 105 is etched using the remaining target patterns 110 as a etch mask, thereby forming a fine gate 107. A process window may be increased using the DPT process and the fine gate 107 may be formed, but aspects of the present inventive concept are not limited thereto.

Hereinafter, a method for fabricating a semiconductor device according to another exemplary embodiment of the present inventive concept will be described with reference to FIGS. 16 to 19.

FIGS. 16 to 19 illustrate intermediate process steps for explaining a method for fabricating a semiconductor device according to an exemplary embodiment of the present inventive concept.

For the convenience of description, description of the same elements as in the above embodiment will be omitted.

FIGS. 16 to 19 are plan views illustrating intermediate process steps for a method for fabricating a semiconductor device according to an exemplary embodiment of the present inventive concept. An X-Y plane is illustrated in FIGS. 16 to 19.

Figure 16:
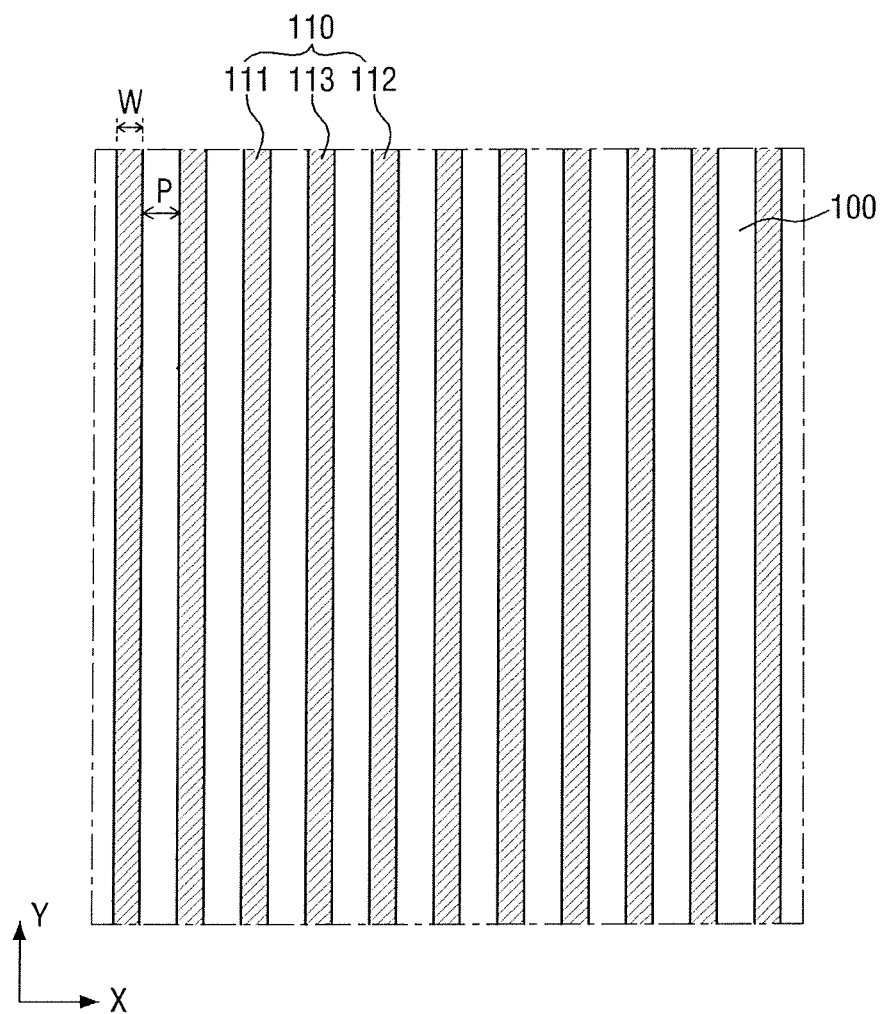
FIGS. 16 to 19 illustrate a method for fabricating a semiconductor device according to an exemplary embodiment of the present inventive concept.

Referring to FIG. 16, target patterns 110 are formed on a first hard mask layer 105 positioned on a substrate 100. The target patterns 110 may extend in parallel to each other in a first direction Y. The first direction Y may be the Y-axis direction. Each of the target patterns 110 has a width W. The target patterns 110 are arranged at a spacing P. The target patterns 110 are arranged in plurals on the substrate 100, and are in parallel to each other. The target patterns 110 shown in FIG. 16 may be formed in substantially the same manner with the target patterns 110 shown in FIG. 2.

A first mask pattern 202 overlaps the target patterns 112. The first opening 230 overlaps two target patterns 111 and 113. For example, the first opening 230 overlaps the entire top surfaces of two consecutive target patterns 111 and 113, but aspects of the present inventive concept are not limited thereto. A second mask pattern 302 overlap n consecutive target patterns. The target patterns 111-113 may include spacers (not shown) and gates (not shown).

The first opening 220 and the target patterns 111 and 113 are alternately arranged in parallel to each other. The first opening 230 bisects the first mask pattern 200. The first opening 230 has a width of a first length L11. The first length L11 may be greater than m times the spacing P between the target patterns 110, where m is the number of the target patterns 110 overlapped by the first opening 230. For example, when the first opening 230 overlaps two target patterns 111 and 113, the first length L11 may be two times the spacing P, but aspects of the present inventive concept are not limited thereto.

Figure 17:
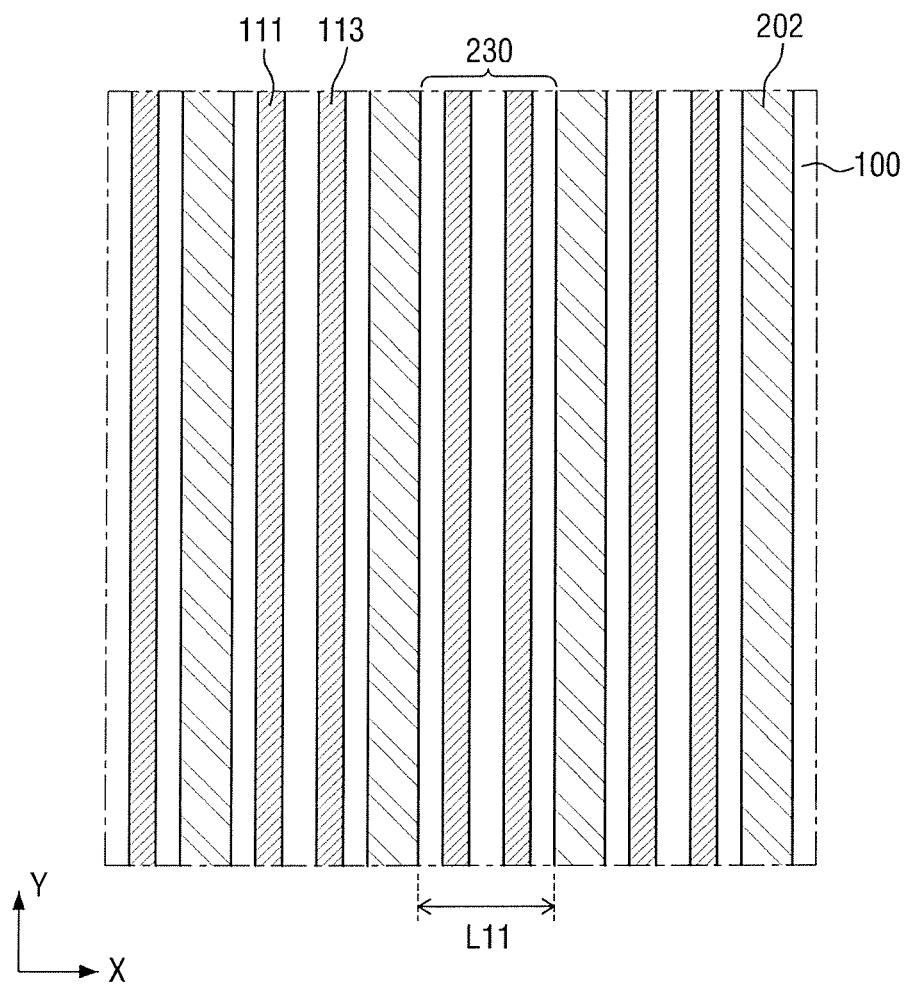
Figure 18:
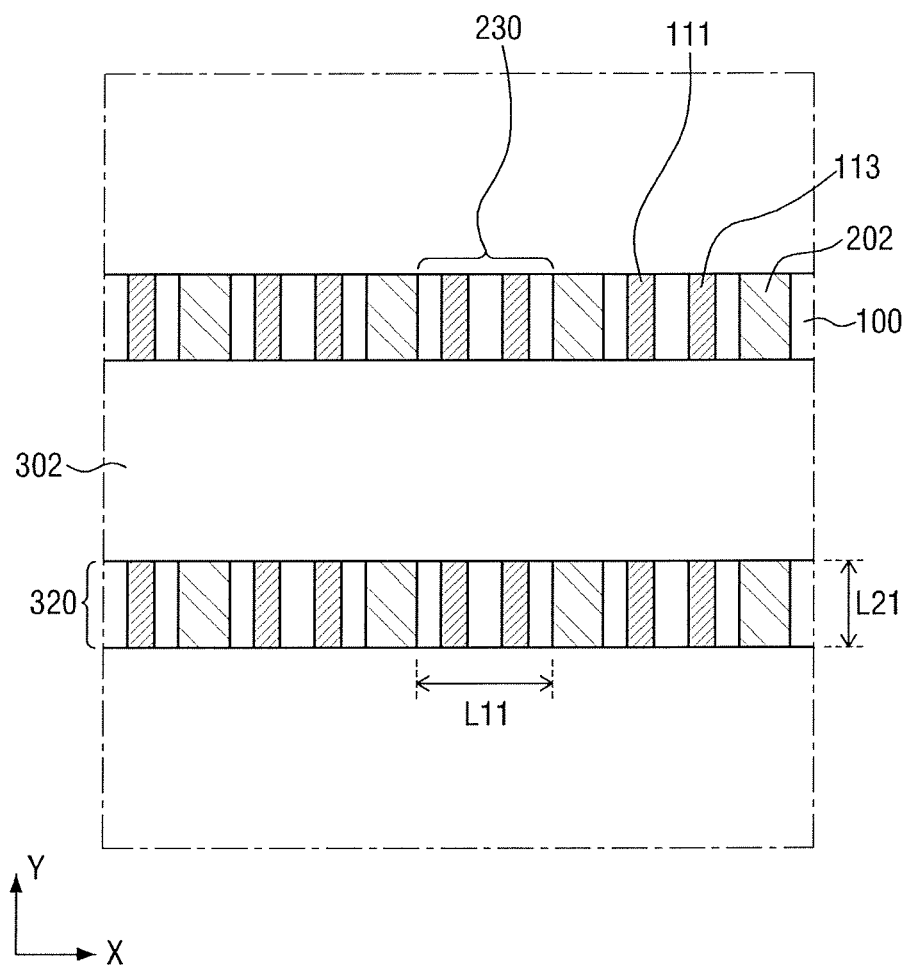

Referring to FIG. 18, after the process step shown in FIG. 17, a second mask pattern 302 is formed. The second mask pattern 302 may be formed in substantially the same manner with the second mask pattern 302 shown in FIG. 8. The second mask pattern 300 includes a second opening 330 extending in a second direction X crossing the first direction Y and overlapping with the first opening 230.

The second mask pattern 302 may overlap portions of the target patterns 110 and the first mask pattern 202. The second mask pattern 302 crosses the first mask pattern 202. For example, the second direction X in which the second mask pattern 300 extends may be orthogonal to the first direction Y in which the first mask pattern 200 extends, but aspects of the present inventive concept are not limited thereto. The first direction Y may form an acute angle or an obtuse angle with respect to the second direction X.

The second mask pattern 302 may include a second opening 320. The second opening 320 has a width of a second length L21. The second length L21 of the second opening 320 is measured along the first direction Y. The second opening 320 crosses portions of the plurality of target patterns 110, the first mask pattern 202 and the first opening 230.

The second mask pattern 302 includes a plurality of second openings 320. The second openings 320 overlaps the plurality of target patterns 110. For example, the second openings 320 extending in the second direction X overlap portions of top surfaces of the plurality of target patterns 110 extending in the first direction Y. The second mask pattern 302 may overlap with some of the plurality of target patterns 110 overlapped by the first opening 202.

The overlapping region of the first opening 230 and the second opening 330 has an area corresponding to a product of the first length L11 and the second length L21 (i.e., L11×L21).

Figure 19:
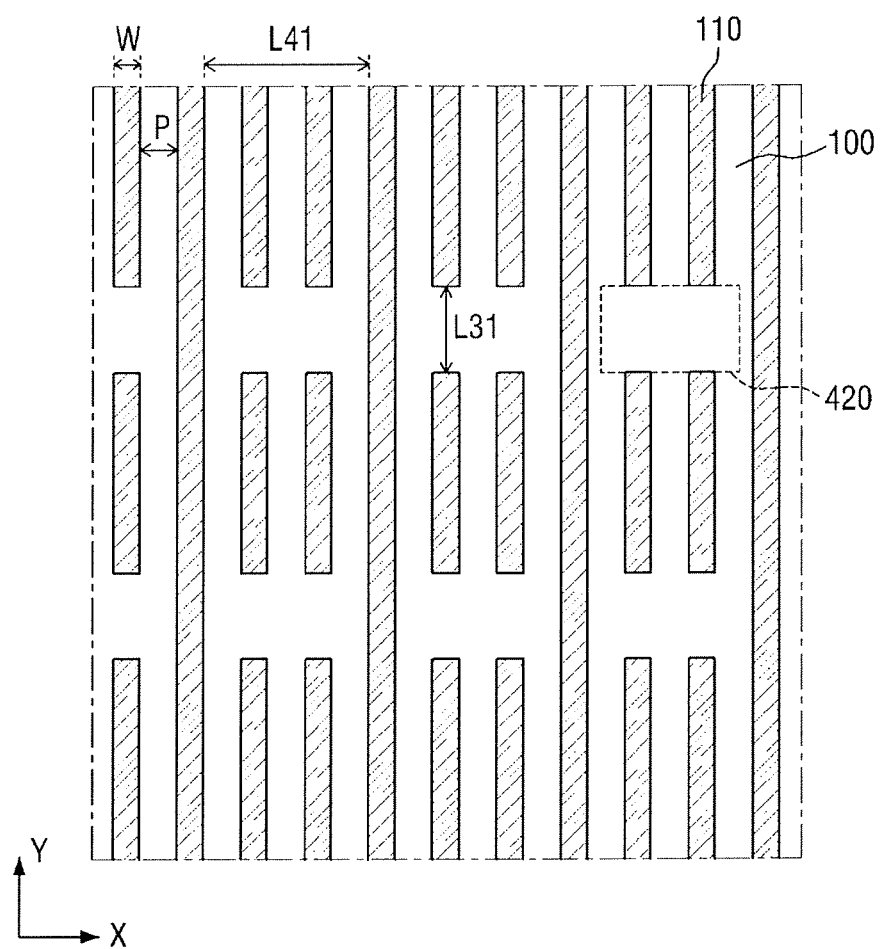

Referring to FIG. 19, regions of the target patterns 110 overlapping with the first opening 230 and the second opening 320 are etched using the first mask pattern 200 and the second mask pattern 302 as etch masks. For example, the target patterns 110 disposed under the overlapped regions of the first and second openings 230 and 320 are etched using the first and second mask patterns 202 and 302 as a etch mask.

A region of a gate (not shown) etched through the etching process may have a third length L31 in the first direction Y. Spacings between two neighboring unetched target patterns 110 has a fourth length L41. An etched target pattern region 420, and the unetched target pattern 110 are alternately disposed in the first direction Y. The unetched target pattern 110 are overlapped with the first mask pattern 200 which serves as a etch mask in the etching process to form the etched target pattern region 420. The etched target pattern region 420 is substantially the same with the overlapping region of the first opening 230 and the second opening 330. The third length L31 corresponds to the second length L21 and a difference between the third length L31 and the second length L21 has a constant value of skew. The value of skew may be used in OPC, but aspects of the present inventive concept are not limited thereto.

Hereinafter, a method for fabricating a semiconductor device according to an exemplary embodiment of the present inventive concept will be described with reference to FIGS. FIGS. 20 to 22.

Figure 20:
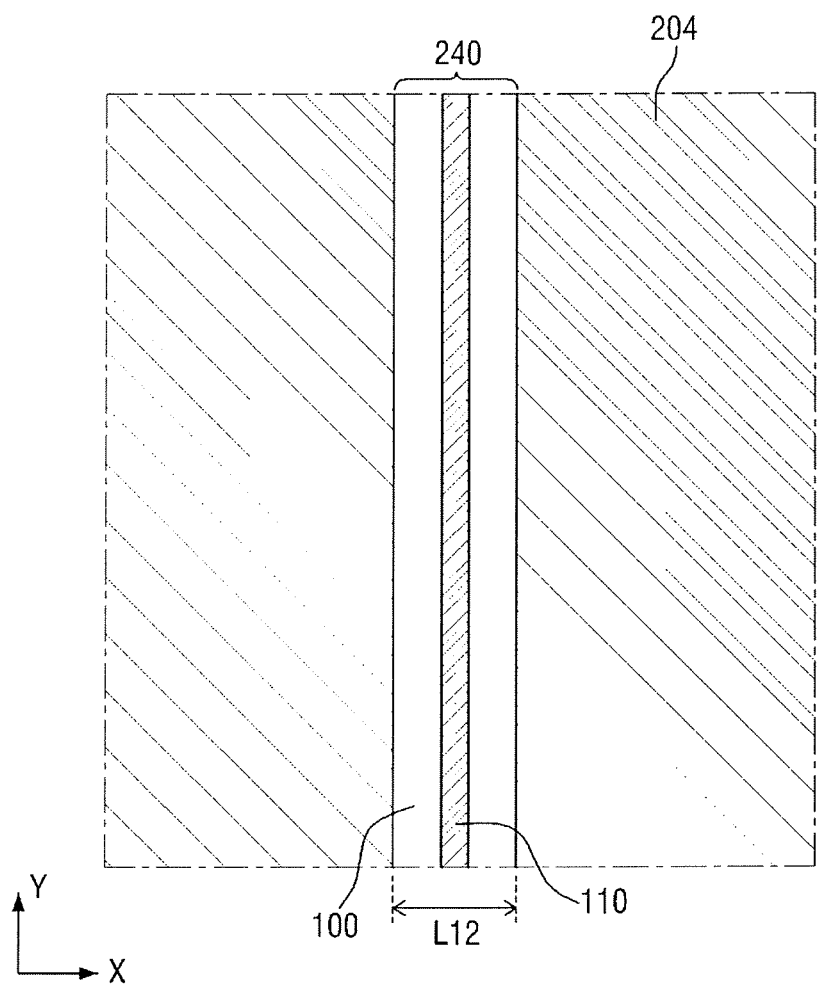
FIGS. 20 to 22 illustrate a method for fabricating a semiconductor device according to an exemplary embodiment of the present inventive concept.
Figure 21:
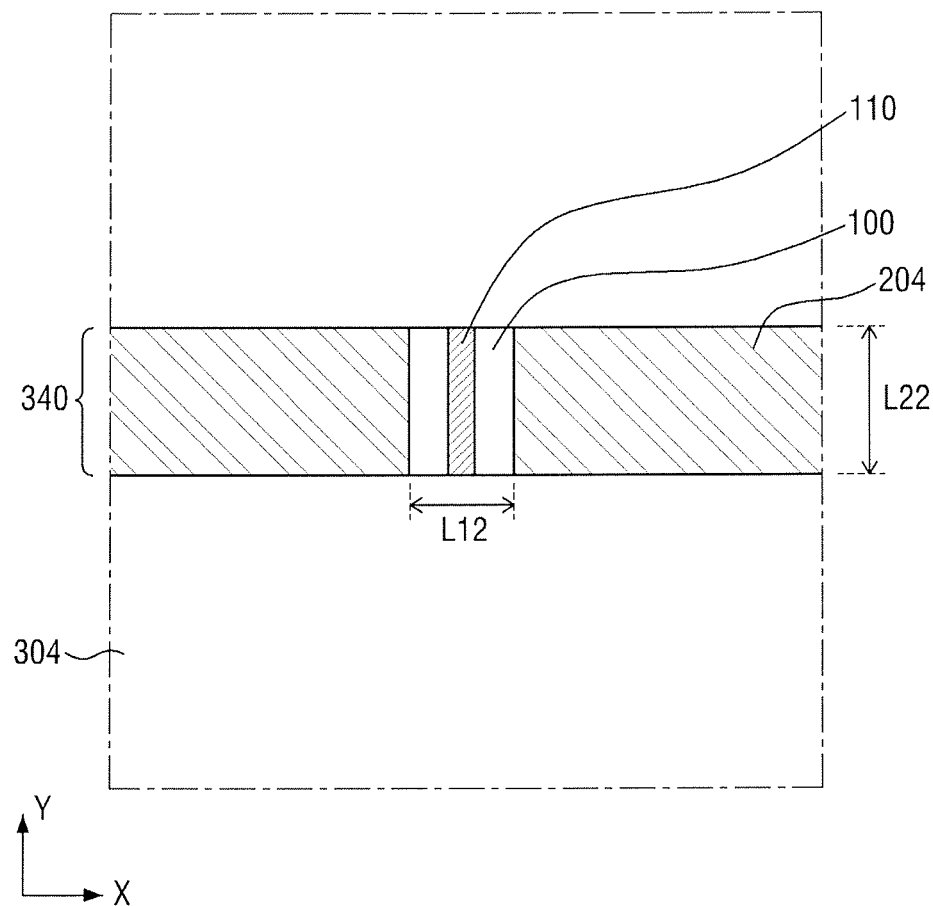
Figure 22:
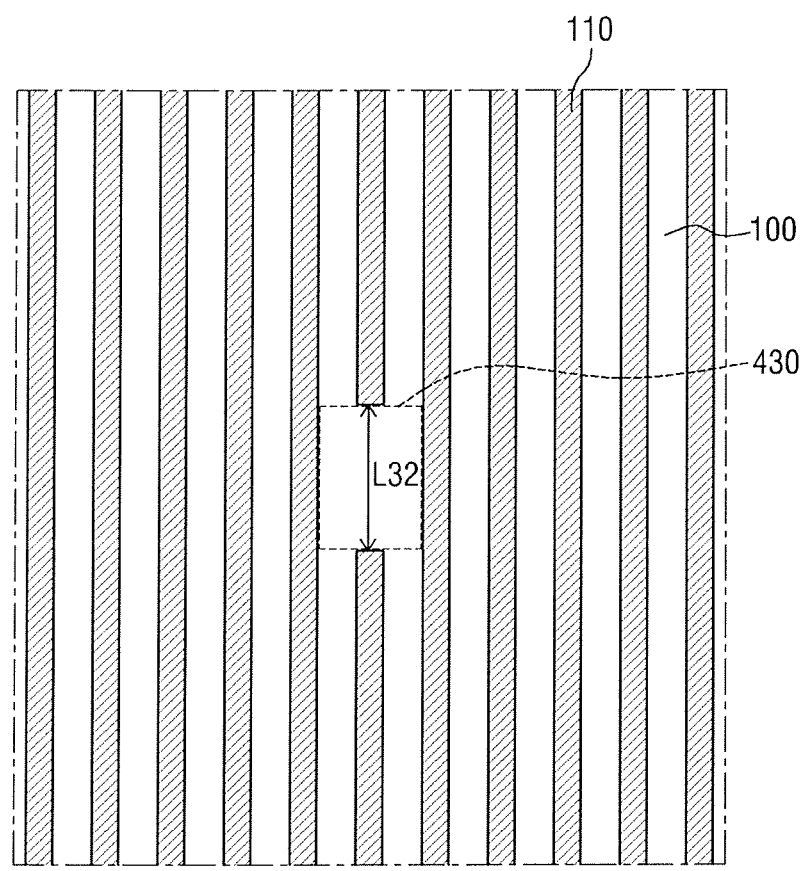

FIGS. 20 to 22 illustrate intermediate process steps for a method for fabricating a semiconductor device according to an exemplary embodiment of the present inventive concept.

For the convenience of description, description of the same elements as in the above embodiment will be omitted.

FIGS. 20 to 22 are plan views illustrating intermediate process steps for a method for fabricating a semiconductor device according to still another exemplary embodiment of the present inventive concept and an X-Y plane is illustrated in FIGS. 20 to 22.

Referring to FIG. 20, after the process step shown in FIG. 16, a first mask pattern 204 is formed. The first mask pattern 204 include a first opening 240 extending in a first direction Y and overlapping a single target pattern 110 among a plurality of target patterns 110.

The first mask pattern 204 may overlap with a plurality of consecutive target patterns 110. The first opening 240 overlaps a single target pattern 110. For example, the first opening 240 may expose the entire top surface of the single target pattern 110.

The first opening 240 and the exposed target pattern 110 are arranged in parallel to each other. The first opening 240 may bisect the first mask pattern 204. The exposed target pattern 110 may also bisect the first mask pattern 204. The first opening 240 has a width of a first length L12. The first length L12 are greater than the width W of the target pattern 110.

Referring to FIG. 21, after the process step shown in FIG. 20, a second mask pattern 304 is formed. The second mask pattern 304 includes a second opening 340 extending in a second direction X crossing the first direction Y and overlapping the first opening 240. The second opening 340 has a width of a second length L22.

The second mask pattern 304 overlaps portions of the target pattern 110 and the first mask pattern 204. The second mask pattern 304 and the first mask pattern 204 crosses each other. For example, the second direction X in which the second mask pattern 304 extends may be orthogonal to the first direction Y in which the first mask pattern 204 extends, but aspects of the present inventive concept are not limited thereto. Alternatively, the first direction Y may form an acute angle or an obtuse angle with respect to the first direction Y.

The second length L22 of the second opening 340 is measured along the first direction Y. The second opening 340 may expose portions of the one target pattern 110, the first mask pattern 204 and the first opening 240. For example, the second opening 340 extending in the second direction X overlaps a portion of the top surface of the target pattern 110 extending in the first direction Y. The second mask pattern 304 overlaps a portion of the target pattern 110 overlapped by the first opening 240. The second mask pattern 304 and the target pattern 110 cross each other.

The overlapping region of the first opening 240 and the second opening 340 has an area corresponding to a product of the first length L12 and the second length L21 (i.e., L12×L22).

Referring to FIG. 22, the region of the target pattern 110 disposed under the overlapped region of the first opening 240 and the second opening 340 is etched using the first mask pattern 204 and the second mask pattern 304 as etch masks. For example, the target pattern 110 disposed under the overlapped region of the first opening 240 and the second opening 340 is etched using the first and second mask patterns 204 and 304.

A target pattern region 430 etched through the etching process has a third length L32 in the first direction Y. The third length L32 corresponds to the second length L22 and a difference between the third length L32 and the second length L22 has a constant value of skew. The value of skew may be used in OPC, but aspects of the present inventive concept are not limited thereto.

Hereinafter, a method for fabricating a semiconductor device according to an exemplary embodiment of the present inventive concept will be described with reference to FIGS. FIGS. 23 to 25.

Figure 23:
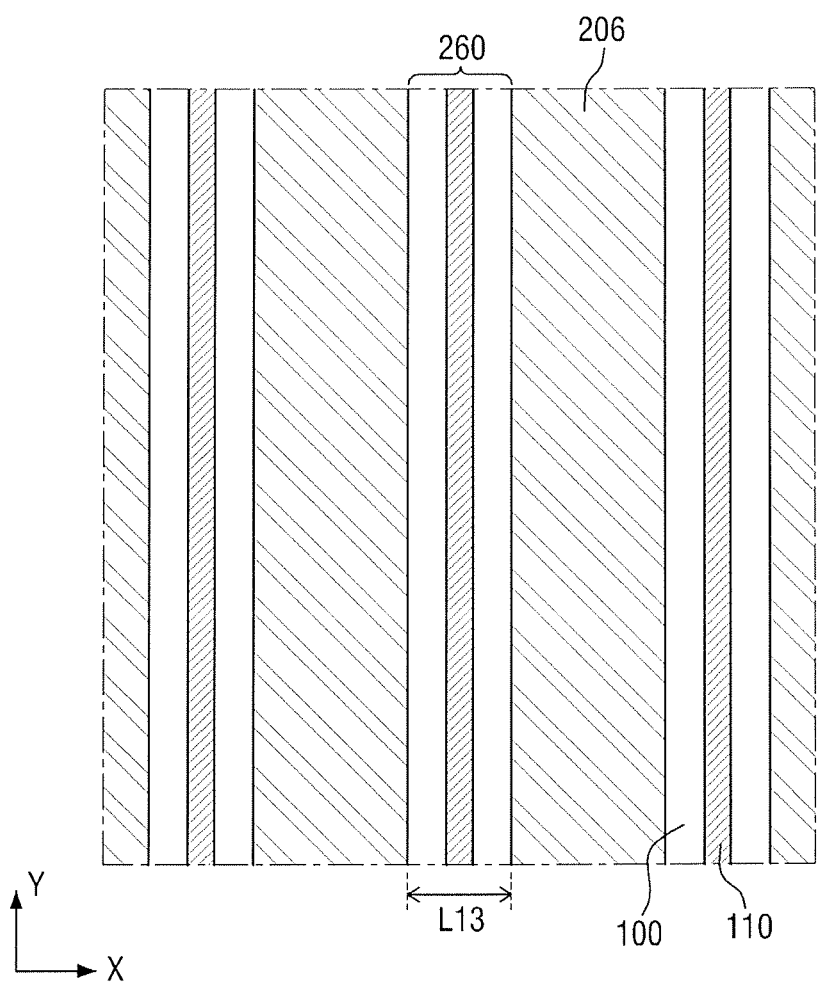
FIGS. 23 to 25 illustrate a method for fabricating a semiconductor device according to an exemplary embodiment of the present inventive concept.
Figure 24:
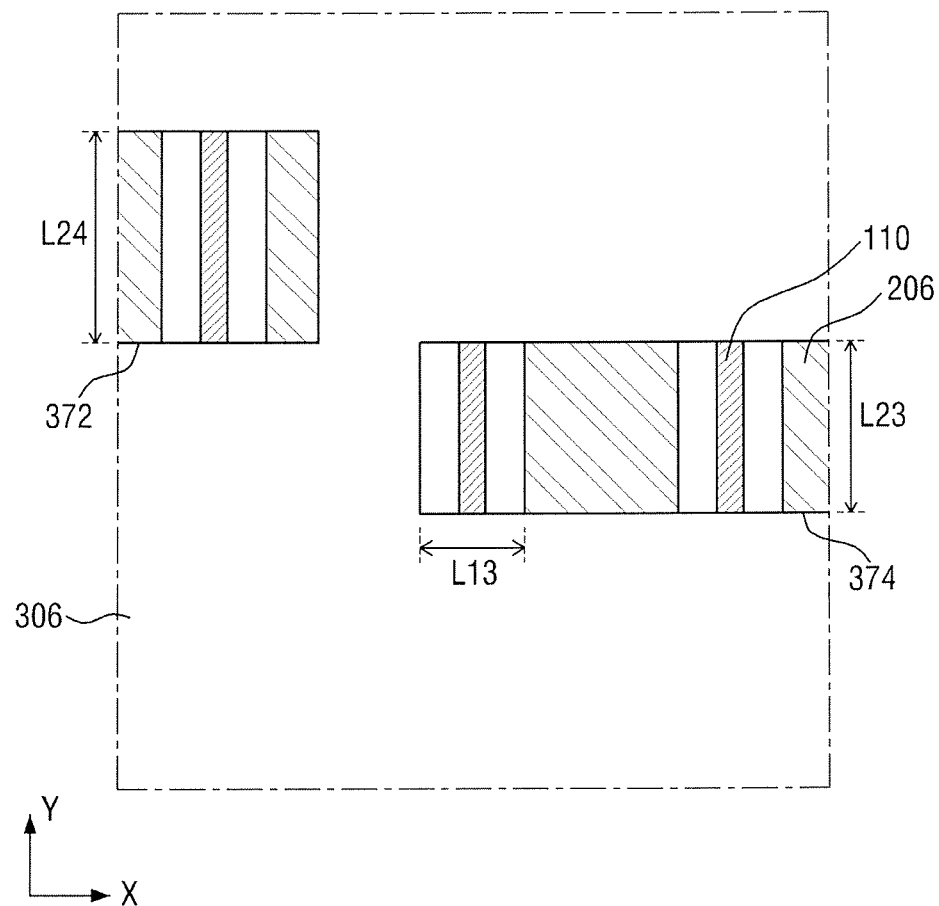
Figure 25:
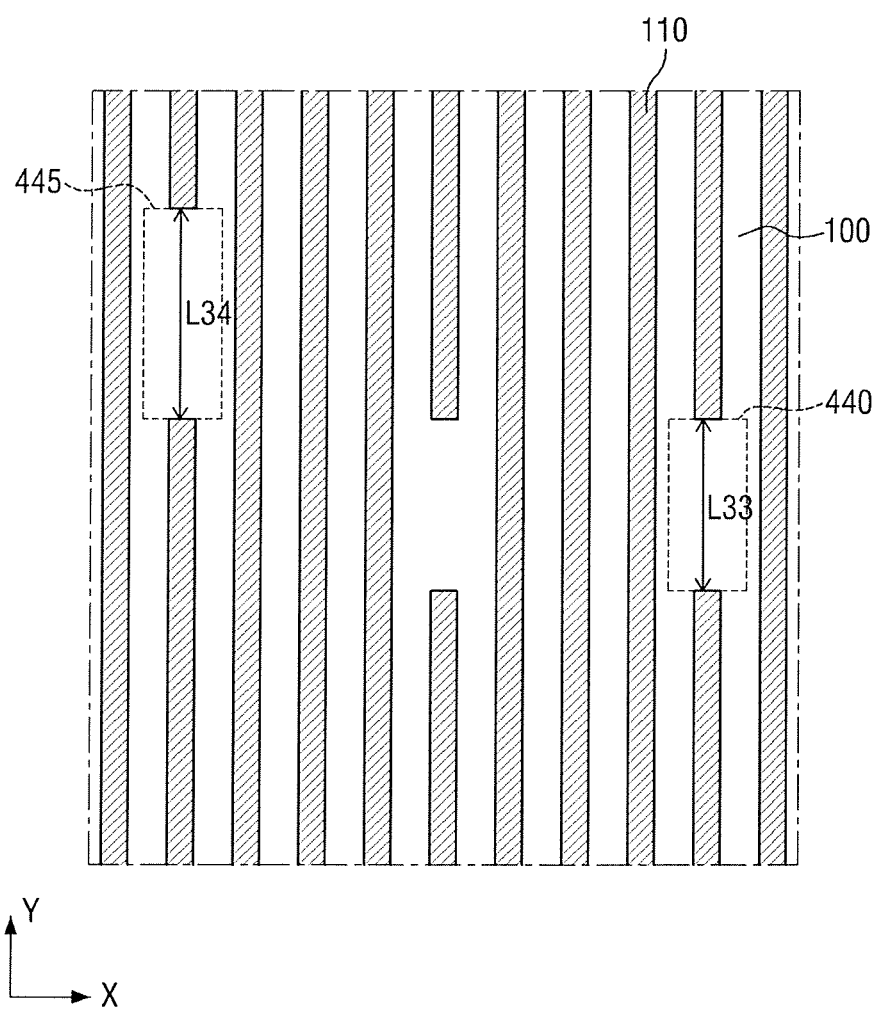

FIGS. 23 to 25 illustrate intermediate process steps for a method for fabricating a semiconductor device according to an exemplary embodiment of the present inventive concept. For the convenience of description, description of the same elements as in the above embodiment will be omitted.

FIGS. 23 to 25 are plan views illustrating intermediate process steps for a method for fabricating a semiconductor device according to an exemplary embodiment of the present inventive concept. An X-Y plane is illustrated in FIGS. 23 to 25.

Referring to FIG. 23, after the process step shown in FIG. 16, a first mask pattern 206 is formed. The first mask pattern 206 includes a first opening 260 overlapping some of a plurality of target patterns 110 extending in a first direction Y. The first mask pattern 206 shown in FIG. 23 may be formed in substantially the same manner with the first mask pattern 200 shown in FIG. 5.

The first opening 260 of the first mask pattern 206 has a width of a first length L13. The first length L13 may be greater than a spacing P between the target patterns 110 of FIG. 16, but aspects of the present inventive concept are not limited thereto.

Referring to FIG. 24, after the process step shown in FIG. 23, a second mask pattern 306 is formed. The second mask pattern 306 includes second openings 372 and 374 overlapping the first opening 260. The second openings 372 and 374 may be randomly arranged on the second mask pattern 306. The second openings 372 and 374 need not bisect the second mask pattern 306. The second openings 372 and 374 may be arranged to form gate patterns for a logic circuit. For example, the second openings 372 and 374 overlap a portion of a single target pattern 110 or portions of two or more consecutive target patterns 110, but aspects of the present inventive concept are not limited thereto.

The second mask pattern 306 overlaps portions of the target patterns 110 and the first mask pattern 206. The second openings 372 and 374 cross the first openings 260.

The second opening 372 has a width of a second length L24; and the second opening 374 has a width of a fourth length L23. The lengths L23 and L24 are measured along the first direction Y. The second openings 372 and 374 overlap portions of the plurality of target patterns 110, the first mask pattern 206 and the first opening 260. For example, the second openings 372 and 374 extending in the second direction X cross top surfaces of the plurality of target patterns 110 extending in the first direction Y. The second mask pattern 306 overlaps some of the plurality of target patterns 110 overlapped by the first opening 260.

The overlapping region of the first opening 260 and the second opening 372 has an area corresponding to a product of the first length L13 and the second length L24 (i.e., L13×L24); and the overlapping region of the first opening 260 and the second opening 374 has an area corresponding to a product of the first length L13 and the fourth length L23 (i.e., L13×L23).

Referring to FIG. 25, regions of the target patterns 110 disposed under overlapped regions of the first opening 260 and each of the second openings 372 and 374 are etched using the first mask pattern 206 and the second mask pattern 306 as etch masks. For example, the plurality of target patterns 110 overlapped by first opening 260 and each of the first and second openings 372 and 374 are etched using the first and second mask patterns 206 and 306. The overlapping regions may be randomly formed by adjusting positions of the second openings 372 and 374.

Target pattern regions 440 and 445 are etched through a etching process. The target pattern region 440 has a third length L33 in the first direction Y; and the target pattern region 445 has a fifth length L34 in the first direction. Three unetched target patterns disposed between the etched target pattern regions 440 and 445 are disposed under the first mask pattern 206. The etched target pattern regions 440 and 445 may be substantially the same with the overlapping regions of the first opening 260 and the second openings 372 and 374. The third length L33 may correspond to the second length L23 and a difference between the third length L33 and the second length L23 has a constant value of skew. Likewise, the third length L34 may correspond to the second length L24 and a difference between the fourth length L24 and the fifth length L34 may have a constant value of skew.

The value of skew may be used in OPC, but aspects of the present inventive concept are not limited thereto.

A method for fabricating a semiconductor device according to an exemplary embodiment of the present inventive concept having been described above with reference to FIGS. 1 to 25 may be applied to the process of forming a pull-up transistor (PU) or a pull-down transistor (PD) of a static random access memory (SRAM), but aspects of the present inventive concept are not limited thereto.

Figure 26:
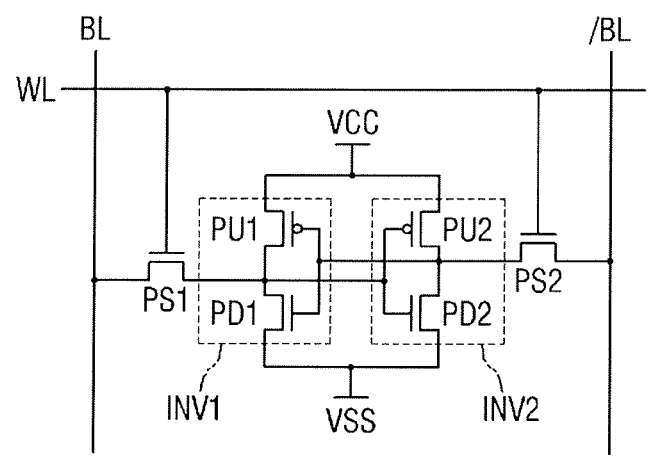
FIGS. 26 and 27 are a circuit diagram and a layout illustrating a semiconductor device fabricated according to an exemplary of the present inventive concept.
Figure 27:
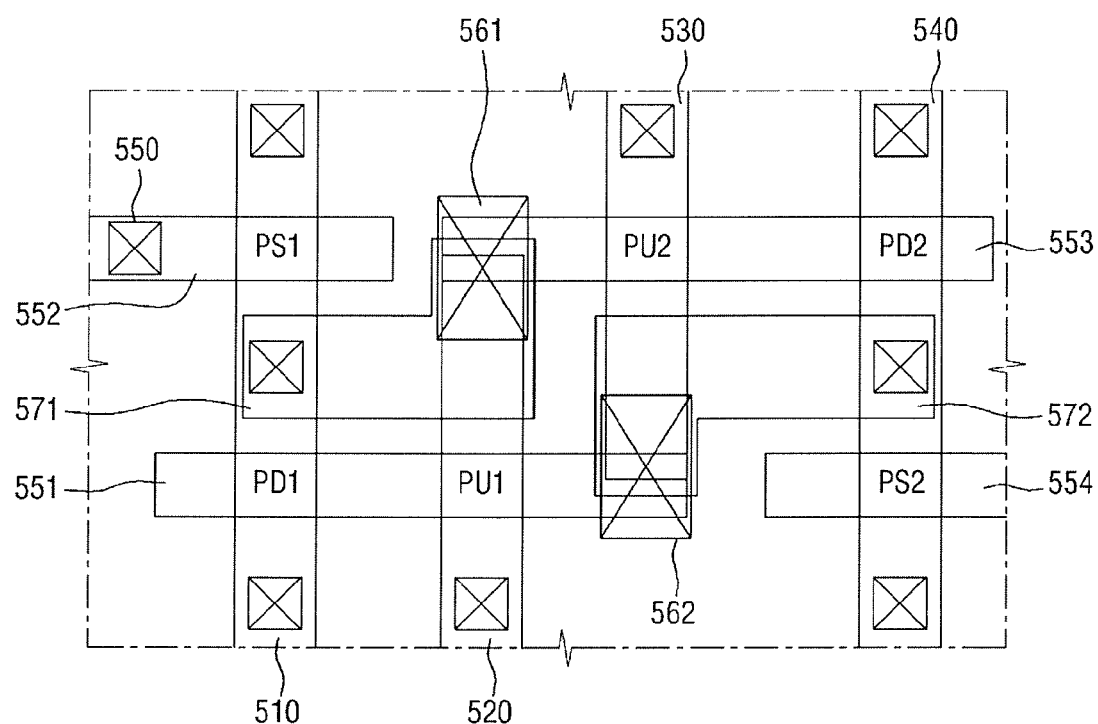

FIGS. 26 and 27 are a circuit diagram and a layout view illustrating a semiconductor device fabricated according to an exemplary embodiment of the present inventive concept.

Referring to FIGS. 26 and 27, the semiconductor device fabricated according to an exemplary embodiment of the present inventive concept includes a pair of inverters INV1 and INV2 connected in parallel between a power supply node Vcc and a ground node Vss, and a first pass transistor PS1 and a second pass transistor PS2 connected to output nodes of the inverters INV1 and INV2. The first pass transistor PS1 and the second pass transistor PS2 are connected to a bit line BL and a complementary bit line BL/. Gates of the first pass transistor PS1 and the second pass transistor PS2 are connected to a word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 are p-type metal oxide semiconductor (PMOS) transistors, and the first pull-down transistor PD1 and the second pull-down transistor PD2 are n-type metal oxide semiconductor (NMOS) transistors.

In addition, to constitute a latch circuit, an input node of the first inverter INV1 is connected to an output node of the second inverter INV2 and an input node of the second inverter INV2 is connected to an output node of the first inverter INV1.

Referring to FIGS. 26 and 27, a first active region 520, a second active region 510, a third active region 530 and a fourth active region 540, which are spaced apart from one another, extend lengthwise in one direction (e.g., in an up-and-down direction of FIG. 27). The second active region 510 and the third active region 530 may extend in smaller lengths than the first active region 520 and the fourth active region 540.

In addition, a fifth gate electrode 551, a sixth gate electrode 552, a seventh gate electrode 553, and an eighth gate electrode 554 are formed to extend in the other direction (for example, in a left-and-right direction of FIG. 27) to intersect the first active region 520 to the fourth active region 540. For example, the fifth gate electrode 551 completely intersects the first active region 520 and the second active region 510 while partially overlapping an end portion of the third active region 530. The seventh gate electrode 553 completely intersects the fourth active region 540 and the third active region 530 while partially overlapping an end portion of the second active region 510. The sixth gate electrode 552 and the eighth gate electrode 554 are formed to intersect the second active region 510 and the fourth active region 540, respectively.

The fifth gate electrode 551, the sixth gate electrode 552, the seventh gate electrode 553, and the eighth gate electrode 554 may correspond to etched target patterns fabricated according to an exemplary embodiment of the present inventive concept. For example, a single gate is formed and then patterned using first and second hard mask patterns, thereby forming the seventh gate electrode 553 and the sixth gate electrode 552. The fifth gate electrode 551 and the eighth gate electrode 554 may also be formed using the same method with the seventh gate electrode 553 and the sixth gate electrode 552, but aspects of the present inventive concept are not limited thereto.

The first pull-up transistor PU1 is formed on an intersection of the fifth gate electrode 551 and the first active region 520; the first pull-down transistor PD1 is formed on an intersection of the fifth gate electrode 551 and the second active region 510; and the first pass transistor PS1 is formed on an intersection of the sixth gate electrode 552 and the second active region 510. The second pull-up transistor PU2 is formed on an intersection of the seventh gate electrode 553 and the third active region 530; the second pull-down transistor PD2 is formed on an intersection of the seventh gate electrode 553 and the fourth active region 540; and the second pass transistor PS2 is formed on an intersection of the eighth gate electrode 554 and the fourth active region 540.

Although not specifically shown, sources/drains may be formed on both sides of the respective intersections of the fifth to eighth gate electrodes 551-554 and the first to fourth active region 520, 510, 530 and 540.

In addition, a plurality of contacts 550 are formed.

Further, the first active region 520, the seventh gate electrode 553 and a wire 571 are connected to each other through a shared contact 561. The third active region 530, the fifth gate electrode 551 and a wire 572 are connected to each other through a shared contact 562.

For example, the first pull-up transistor PU1 and the second pull-up transistor PU2 may have the same configurations as those of the transistors in the first region I shown in FIGS. 11 and 20, and the first pull-down transistor PD1, the first pass transistor PS1, the second pull-down transistor PD2, and the second pass transistor PS2 may have the same configurations as those of the transistors in the second region II shown in FIGS. 11 and 20.

Figure 28:
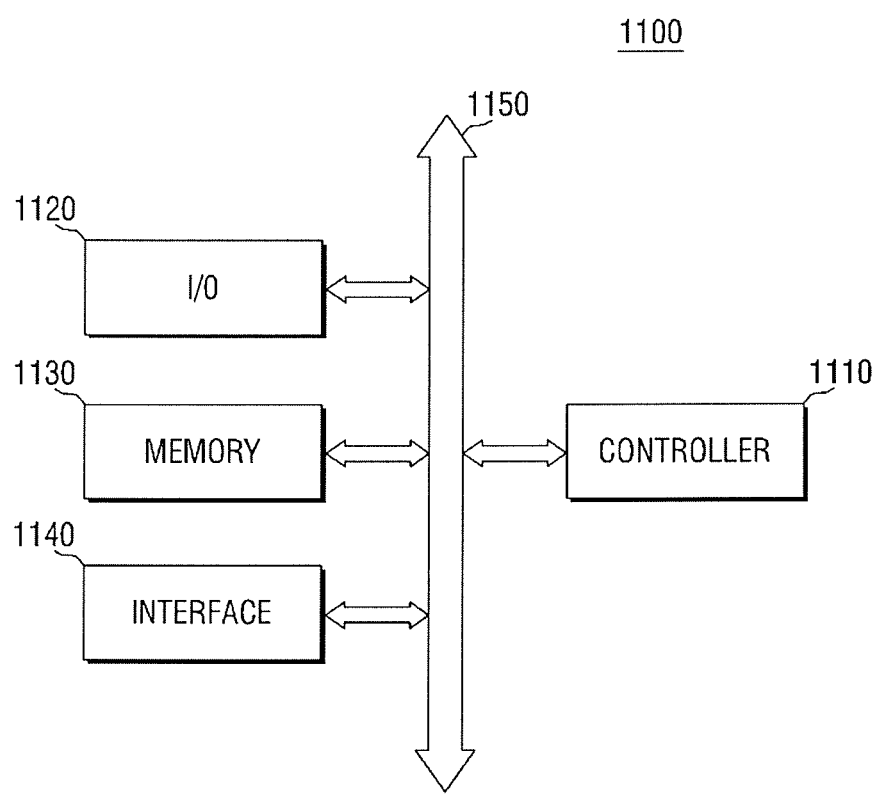
FIG. 28 is a block diagram of an exemplary electronic system including a semiconductor device according to an exemplary embodiment of the present inventive concept.

FIG. 28 is a block diagram of an electronic system including a semiconductor device according to an exemplary embodiment of the present inventive concept.

Referring to FIG. 28, the electronic system 1100 may include a controller 1110, an input/output device (I/O) 1120, a memory device 1130, an interface 1140 and a bus 1150. The controller 1110, the I/O 1120, the memory device 1130, and/or the interface 1140 are connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include a high-speed dynamic random access memory (DRAM) device and/or an SRAM device as a working memory for the operation of the controller 1110. A semiconductor memory device according to an exemplary embodiment may be included in the memory device 1130 and/or the controller 1110 and/or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 29:
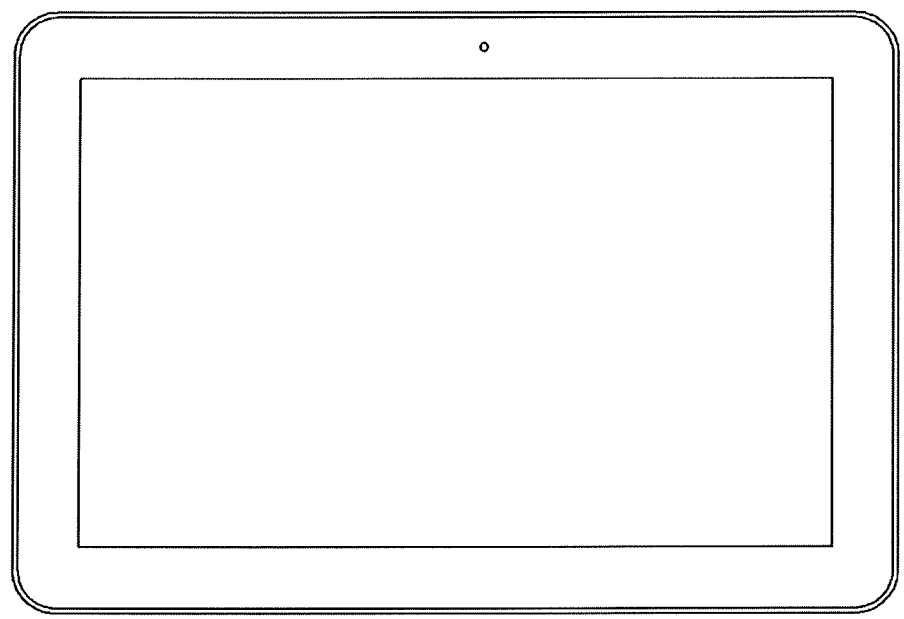
FIGS. 29 and 30 illustrate an exemplary semiconductor system including a semiconductor device according to an exemplary embodiment of the present inventive concept.
Figure 30:
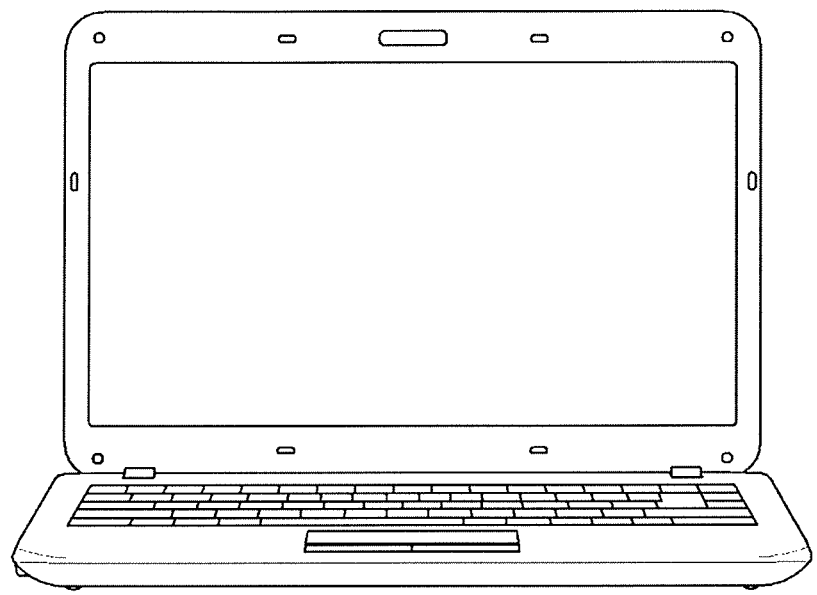

FIGS. 29 and 30 illustrate exemplary semiconductor systems including a semiconductor device according to an exemplary embodiment of the present inventive concept. FIG. 29 illustrates an exemplary tablet PC, and FIG. 30 illustrates an exemplary notebook computer. A semiconductor device according to an exemplary embodiment may be included in a tablet PC, a notebook computer, and the like. The present inventive concept is not limited thereto. For example, various semiconductor systems may include a semiconductor device according to an exemplary embodiment of the present inventive concept.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, the method comprising:
    forming a first hard mask layer on a substrate;
    forming a plurality of spacers on the first hard mask layer;
    forming a second hard mask layer covering the first hard mask layer and the plurality of spacers;
    forming a block hard mask layer on the second hard mask layer;
    forming a first mask pattern on the block hard mask layer, wherein the first mask pattern includes a first opening overlapping at least one spacer;
    forming a second mask pattern having a second opening on the first mask pattern, wherein the second opening overlaps the first opening to form an overlapped opening region; and
    etching a region of the plurality of spacers through the overlapped opening region using the first mask pattern and the second mask pattern as an etch mask, wherein the region of the plurality of spacers and the overlapped opening region overlap each other.

2. The method of claim 1, wherein the etching of the region of the plurality of spacers comprises sequentially etching the block hard mask layer and the second hard mask layer through the overlapped opening region using the first mask pattern and the second mask pattern as an etch mask.

3. The method of claim 1, wherein the first mask pattern includes a metal-based hard mask.

4. The method of claim 1, wherein the second mask pattern includes a carbon-based hard mask.

5. The method of claim 4, wherein the second mask pattern and the second hard mask layer include substantially the same material as each other.

6. The method of claim 1, wherein after the etching of the spacers, the remaining spacers are used in double patterning technology (DPT).

* * * * *